US012209008B2

United States Patent
Boni et al.

(10) Patent No.: US 12,209,008 B2
(45) Date of Patent: Jan. 28, 2025

(54) MEMS ACTUATOR FOR IN-PLANE MOVEMENT OF A MOBILE MASS AND OPTICAL MODULE COMPRISING THE MEMS ACTUATOR

(71) Applicant: STMicroelectronics S.r.l., Agrate Brianza (IT)

(72) Inventors: Nicolo' Boni, Mountain View, CA (US); Gabriele Gattere, Castronno (IT); Manuel Riani, Como (IT); Roberto Carminati, Piancogno (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 377 days.

(21) Appl. No.: 17/752,016

(22) Filed: May 24, 2022

(65) Prior Publication Data
US 2022/0380199 A1    Dec. 1, 2022

(30) Foreign Application Priority Data

May 31, 2021   (IT) .................. 102021000014183

(51) Int. Cl.
B81B 3/00          (2006.01)
(52) U.S. Cl.
CPC ...... B81B 3/0018 (2013.01); B81B 2201/025 (2013.01); B81B 2201/032 (2013.01)
(58) Field of Classification Search
None
See application file for complete search history.

(56) References Cited

U.S. PATENT DOCUMENTS

| 10,901,203 B2 * | 1/2021 | Jutzi ................ G02B 26/0841 |
| 2012/0018244 A1 | 1/2012 | Robert |
| 2013/0091949 A1 * | 4/2013 | Huang ................ G01P 15/123 |
| | | 73/514.34 |

(Continued)

FOREIGN PATENT DOCUMENTS

| DE | 102019211383 A1 | 2/2021 |
| EP | 2325910 A1 | 5/2011 |

OTHER PUBLICATIONS

IT Search Report and Written Opinion for priority application, IT 102021000014183, report dated Mar. 18, 2022, 8 pgs.

*Primary Examiner* — Michelle Mandala
(74) *Attorney, Agent, or Firm* — Crowe & Dunlevy LLC

(57) ABSTRACT

A MEMS actuator includes a mobile mass suspended over a substrate in a first direction and extending in a plane that defines a second direction and a third direction perpendicular thereto. Elastic elements arranged between the substrate and the mobile mass have a first compliance in a direction parallel to the first direction that is lower than a second compliance in a direction parallel to the second direction. Piezoelectric actuation structures have a portion fixed with respect to the substrate and a portion that deforms in the first direction in response to an actuation voltage. Movement-transformation structures coupled to the piezoelectric actuation structures include an elastic movement-conversion structure arranged between the piezoelectric actuation structures and the mobile mass. The elastic movement-conversion structure is compliant in a plane formed by the first and second directions and has first and second principal axes of inertia transverse to the first and second directions.

20 Claims, 12 Drawing Sheets

(56) References Cited

U.S. PATENT DOCUMENTS

| | | | |
|---|---|---|---|
| 2016/0084872 A1* | 3/2016 | Naumann | G01P 15/18 73/514.01 |
| 2021/0261403 A1 | 8/2021 | Gattere et al. | |

* cited by examiner

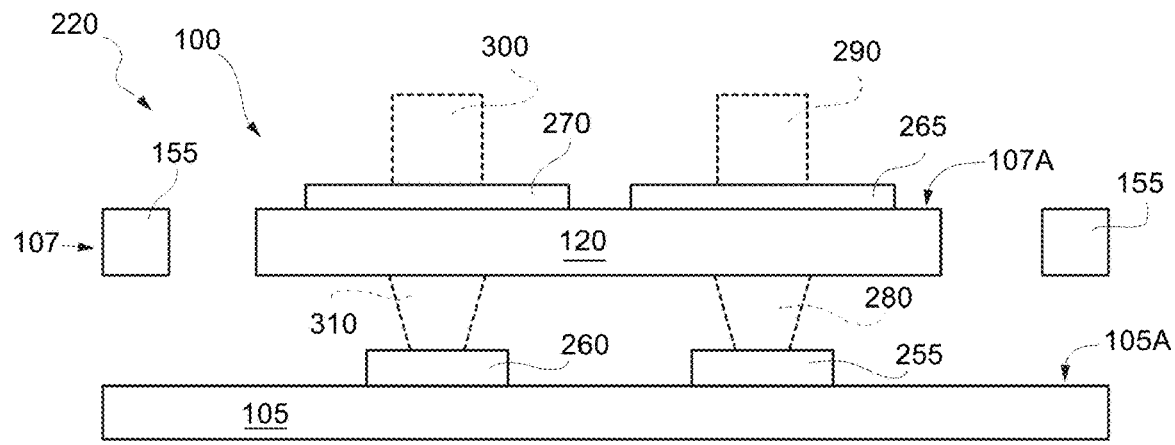
FIG. 20
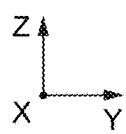
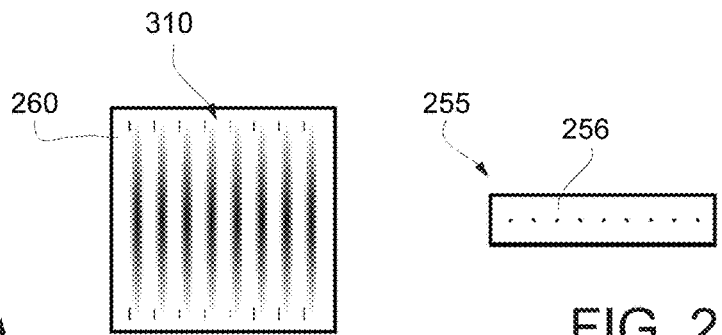
FIG. 21
FIG. 22
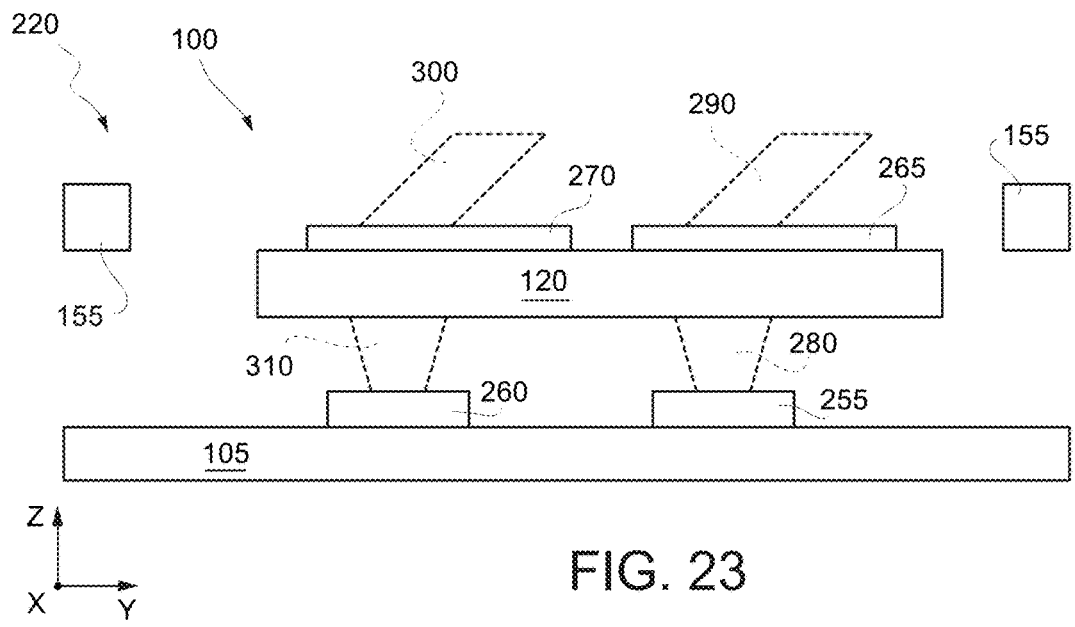
FIG. 23

MEMS ACTUATOR FOR IN-PLANE MOVEMENT OF A MOBILE MASS AND OPTICAL MODULE COMPRISING THE MEMS ACTUATOR

PRIORITY CLAIM

This application claims the priority benefit of Italian Application for Patent No. 102021000014183, filed on May 31, 2021, the content of which is hereby incorporated by reference in its entirety to the maximum extent allowable by law.

TECHNICAL FIELD

This disclosure relates to a Micro-Electro-Mechanical Systems (MEMS) actuator for in-plane movement of a mobile mass, and to an optical module comprising the MEMS actuator.

BACKGROUND

As is known, there is a widespread use of actuators obtained with MEMS technology, starting from a wafer of semiconductor material such as silicon, that are incorporated, for example, in devices for optical applications, electromechanical switches, and micropumps and microvalves for microfluidic applications.

MEMS actuators allow obtainment of devices having small dimensions, low energy consumption, and a high precision of actuation.

In general, a MEMS actuator comprises a substrate, a mobile mass suspended at a certain height over the substrate, and an actuation system which is configured to cause a displacement of the mobile mass using an actuation principle of an electrostatic, piezoelectric, or electromagnetic type.

In specific applications, it is desirable for the actuation system to cause an in-plane translation of the mobile mass, i.e., so as to not modify the height of the mobile mass with respect to the substrate.

For instance, U.S. application patent Ser. No. 17/124,027 filed on Dec. 16, 2020, the content of which is incorporated by reference in its entirety to the maximum extent allowable under the law, discloses an optical apparatus, described briefly hereinbelow, which incorporates a MEMS actuator that utilizes an electrostatic actuation principle.

In detail, FIGS. 1 and 2 show an optical apparatus 1 in a Cartesian reference system XYZ comprising a first axis X, a second axis Y, and a third axis Z.

The optical apparatus 1 comprises a substrate 5, a support frame 7, and an optical layer 10 which is fixed to the substrate 5 by the support frame 7.

An optical detector 13, in particular a two-dimensional array of Single-Photon Avalanche Diodes (SPADs), and a laser source 16, in particular an array of Vertical-Cavity Surface-Emitting Lasers (VCSELs), are bonded on a face of the substrate 5 facing the optical layer 10.

The optical layer 10 forms a plurality of anchorage portions 19 which are integral with the support frame 7, a mobile mass 21, and a plurality of elastic coupling structures 23 which elastically couple the mobile mass 21 to a respective anchorage portion 19.

The elastic coupling structures 23 are configured so as to be compliant along the first axis X and are rigid along the second axis Y and the third axis Z.

The optical layer 10 further supports a transmission lens 25 and a receiving lens 27, which are both supported by the mobile mass 21.

In detail, the transmission lens 25 is arranged above the laser source 16, and the receiving lens 27 is arranged above the optical detector 13.

The apparatus 1 further comprises a first electrostatic actuation system 30A and a second electrostatic actuation system 30B, which are mutually symmetrical with respect to a median axis parallel to the second axis Y.

The first and second electrostatic actuation systems 30A, 30B each comprise a fixed actuation portion 33, a set of fixed electrodes 35, and a set of mobile electrodes 37.

The fixed actuation portions 33 are fixed to the support frame 7 and electrodes of the set of fixed electrodes 35 each extend from the respective fixed actuation portion 33, in a direction parallel to the first axis X, towards the mobile mass 21.

Electrodes of the set of mobile electrodes 37 each extend from the mobile mass 21, in a direction parallel to the first axis X, towards the respective fixed actuation portion 33.

In detail, the electrodes of the set of mobile electrodes 37 are staggered, along the second axis Y, with respect to the electrodes of the set of fixed electrodes 35 so as to form a comb structure. In other words, the electrodes of the set of mobile electrodes 37 and of the set of fixed electrodes 35 are interdigitated with one another.

In use, the laser source 16 generates an emission light beam 40 that propagates towards the optical layer 10 and traverses the transmission lens 25. The transmission lens 25 modifies the shape of the emission light beam 40, generating a modified light beam 42 that propagates in a direction parallel to the third axis Z away from the apparatus 1.

When the modified light beam 42 encounters an object (not illustrated herein), a portion 44 of the modified light beam 42 is reflected by the obstacle and impinges on the reception lens 27. The receiving lens 27 is configured to focus the portion 44 of the modified light beam 42, thus generating a focused beam 46 incident on the optical detector 13.

The optical apparatus 1 is configured to measure a time (time of flight) that has elapsed between sending of the emission light beam 40 and reception of the focused beam 46. From the measurement of the time of flight, the optical apparatus 1 is able to calculate a distance between the object and the optical apparatus 1. The time of flight is in fact a function of the distance between the object and the optical apparatus 1.

By applying a voltage between the set of fixed electrodes 33 and the set of mobile electrodes 35, an electrostatic force is generated along the first axis X, which causes a corresponding translation of the mobile mass 21 in a direction parallel to the first axis X.

This causes the transmitting lens 25 to modify the direction of propagation of the emission light beam, thus generating a tilted light beam light beam 42A. The tilted light beam light beam 42A forms an angle with respect to the third axis Z that varies as a function of the position of the mobile mass 21; it will thus impinge on a different portion of the obstacle, forming a tilted reflected beam 44A.

The tilted reflected beam 44A is focused on the optical detector 13 by the receiving lens 27.

The corresponding time of flight is thus indicative of the distance between the second portion of the object and the optical apparatus 1.

By measuring the time of flight associated with different positions of the mobile mass 21, it is possible to obtain a three-dimensional reconstruction of the object.

In order to scan an object entirely, the mobile mass 21 is displaced by a high amount, along the first axis X, for example greater than 50 μm.

A quasi-static actuation of the first and second electrostatic actuation systems 30A, 30B, for example using a D.C. bias voltage, would cause small values of in-plane displacement of the mobile mass 21, for example comprised between 10 μm and 20 μm.

Accordingly, the first and second electrostatic actuation systems 30A, 30B are actuated in resonance; i.e., a signal is applied having a frequency equal to the resonance frequency of the mobile mass 21.

The resonance actuation causes the displacement of the mobile mass 21 along the first axis X to have a sinusoidal profile in time.

However, in some applications, it is desirable for the displacement of the mobile mass 21 along the first axis X to follow a different profile in time, for example a linear or step-like profile.

SUMMARY

Disclosed herein is a MEMS actuator, including: a substrate; a mobile mass, the mobile mass being suspended over the substrate at a rest height measured along a first direction and extending in a plane of extension defining second direction and third directions perpendicular to the first direction; elastic elements arranged between the substrate and the mobile mass, the elastic elements having a first compliance parallel to the first direction and a second compliance parallel to the second direction, the first compliance being lesser than the second compliance; piezoelectric actuation structures, each piezoelectric actuation structure having a fixed portion that is fixed with respect to the substrate and a mobile portion configured to deform in a direction parallel to the first direction in response to an actuation voltage; and movement-transformation structures. Each movement-transformation structure includes: an elastic movement-conversion structure arranged between a respective one of the piezoelectric actuation structures and the mobile mass, each elastic movement-conversion structure being compliant in a direction parallel to a movement-transformation plane formed by the first and the directions and having, in the movement-transformation plane, a first principal axis of inertia and a second principal axis of inertia, and the first and second principal axes of inertia being transverse with respect to the first and second directions so that a deformation of the piezoelectric actuation structures in the movement-transformation plane causes a corresponding movement of the mobile mass along the second direction.

The mobile mass may have a first and second sides opposite with respect to a median plane parallel to the movement-transformation plane, and third and fourth sides opposite with respect to a median axis parallel to the third direction, wherein the elastic elements are arranged adjacent to the first and second sides of the mobile mass and the movement-transformation structures are arranged adjacent to the third and fourth sides of the mobile mass.

The elastic movement-conversion structures of the movement-transformation structures adjacent to the third and the fourth sides of the mobile mass may have mutually equal shapes, translated along the second direction.

Each elastic movement-conversion structure may include at least one elongated structure including a first elongated portion, a second elongated portion, and a plurality of transverse portions, the first elongated portion and the second elongated portion extending, at rest, generally parallel to one another and to the third direction, and being arranged at different heights from the substrate in the first direction, each transverse portion extending between the first elongated portion and the second elongated portion.

The at least one elongated structure may be a first elongated structure and each elastic conversion structure may also include a second elongated structure coupled to the first elongated structure forming, in a top view of the MEMS actuator, a folded spring.

The second elongated structure may be equal to the first elongated structure and being translated along the second direction.

The elastic elements and the movement-conversion structures may be rigid with respect to the third direction.

The piezoelectric actuation structures may extend parallel to the third direction and may have a free end, wherein the movement-transformation structures each further include an elastic translation structure extending between the free end of a respective piezoelectric actuation structure and a first end of a respective elastic movement-conversion structure, each elastic translation structure being configured to transfer a movement of the free end of the respective deformable structure into a translation of the first end of the respective elastic movement-conversion structure, parallel to the first direction.

Each elastic translation structure may include an elastic decoupling structure and a stiffening structure, the elastic decoupling structure being configured to deform in a direction parallel to the first direction and the third direction, wherein the stiffening structure extends along the third direction between the elastic decoupling structure and the elastic movement-conversion structure.

The stiffening structure may form a frame that surrounds the mobile mass and the elastic movement-conversion structures, the elastic movement-conversion structures being fixed with respect to the frame, each decoupling structure and each piezoelectric actuation structure being arranged externally with respect to the frame.

The piezoelectric actuation structures may each include a first portion and a second portion coupled to the first portion, the first and the second portions each having an elongated structure and extending in a direction parallel to one another, the first portion being coupled to a respective movement-transformation structure, the second portion being coupled to the substrate, the first and the second portions being connected to distinct bias structures configured to deform in the first direction and in a fourth direction parallel to the first direction and opposite thereto.

A set of detection elements may be coupled to the piezoelectric actuation structures.

The set of detection elements may be of a piezoelectric or piezoresistive type.

The mobile mass, the elastic elements, the piezoelectric actuation structures, and the movement-transformation structures may be formed by a monolithic body that is substantially planar at rest, the monolithic body comprising a layer of semiconductor material.

Also disclosed herein is an apparatus, including optical module. The optical module includes a MEMS actuator, the MEMS actuator including a substrate; a mobile mass, the mobile mass being suspended over the substrate at a rest height measured along a first direction and extending in a plane of extension defining second direction and third directions perpendicular to the first direction; elastic elements arranged between the substrate and the mobile mass, the elastic elements having a first compliance parallel to the first direction and a second compliance parallel to the second direction, the first compliance being lesser than the second compliance; piezoelectric actuation structures, each piezoelectric actuation structure having a fixed portion that is fixed with respect to the substrate and a mobile portion configured to deform in a direction parallel to the first direction in response to an actuation voltage; and movement-transformation structures. Each movement-transformation structure includes: an elastic movement-conversion structure arranged between a respective one of the piezoelectric actuation structures and the mobile mass, each elastic movement-conversion structure being compliant in a direction parallel to a movement-transformation plane formed by the first and the directions and having, in the movement-transformation plane, a first principal axis of inertia and a second principal axis of inertia, and the first and second principal axes of inertia being transverse with respect to the first and second directions so that a deformation of the piezoelectric actuation structures in the movement-transformation plane causes a corresponding movement of the mobile mass along the second direction.

A light source is supported by the substrate of the MEMS actuator and configured to generate an initial light beam propagating towards the mobile mass. An optical detector is supported by the substrate of the MEMS actuator and configured to detect an incoming light beam. An output optical element is supported by the mobile mass and facing the light source, the output optical element being configured to modify a direction of propagation of the initial light beam as a function of a relative position between the light source and the output optical element, thereby generating an output light beam. An input optical element is configured to focus the incoming light beam on the optical detector.

The apparatus may be for scanning a light beam an object arranged at a distance from the apparatus. The apparatus may further include a first circuit, configured to measure a time of flight between emission of the initial light beam and reception of a reflected light beam; and a second circuit, configured to apply a bias voltage to the piezoelectric actuation structures of the MEMS actuator, the bias voltage causing a movement of the mobile mass along the second direction, wherein the movement of the mobile mass varies the relative position between the output optical element and the light source, thus modifying the direction of propagation of the output light beam.

BRIEF DESCRIPTION OF THE DRAWINGS

For a better understanding, some embodiments are now described, purely by way of non-limiting example, with reference to the attached drawings, wherein:

FIG. 20 is a cross-section of the present optical module incorporating the MEMS actuator of FIG. 3, in a first condition of use;

FIG. 21 shows a top plan view of a spatial distribution of a light source of the optical module of FIG. 20;

FIG. 22 shows a top plan view of a spatial distribution of a light beam incident on an optical detector of the optical module of FIG. 20;

FIG. 23 is a cross-section of the present optical module incorporating the MEMS actuator of FIG. 3, in a second condition of use;

DETAILED DESCRIPTION

The following description refers to the arrangement represented; consequently, expressions such as "above", "under", "top", "bottom", "right", "left" refer to the attached figures and are not to be interpreted in a limiting way.

Figure 1:
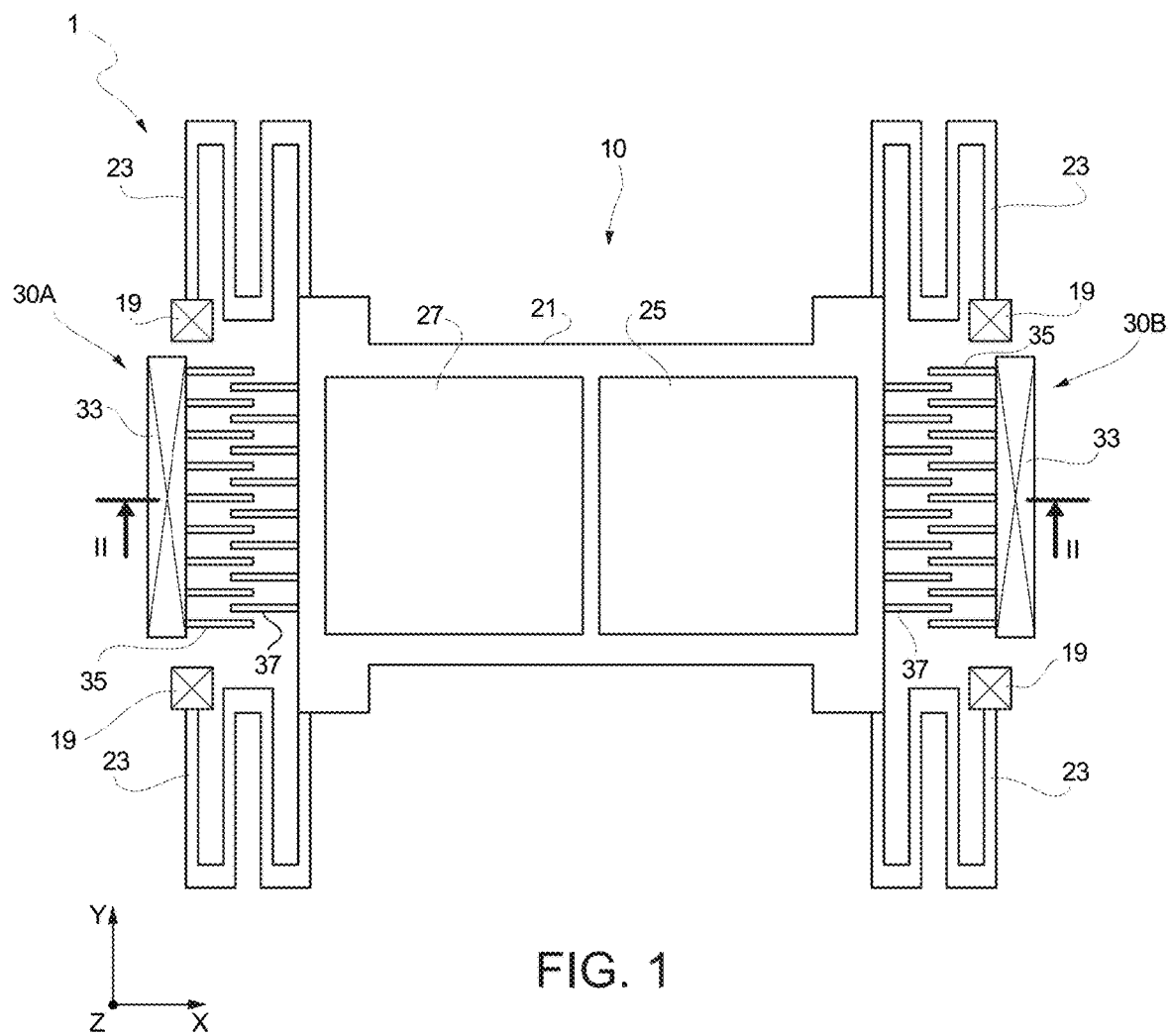
FIG. 1 shows a top plan view of a known optical apparatus.
Figure 2:
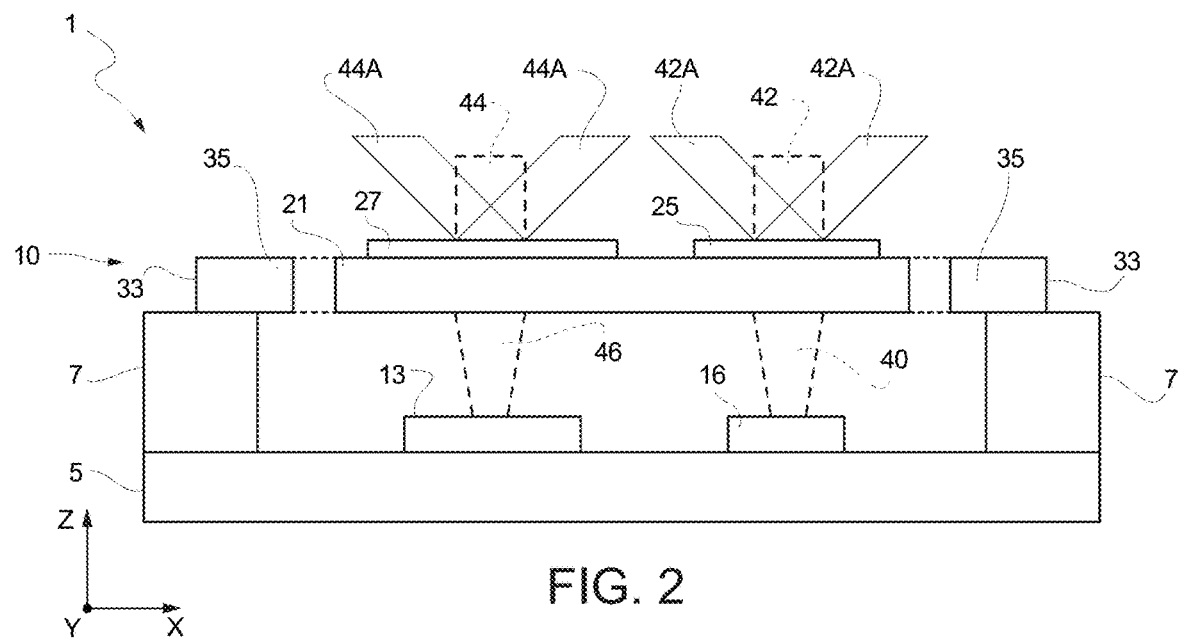
FIG. 2 is a cross-section of the optical apparatus of FIG. 1, along the section line II-II of FIG. 1.
Figure 3:
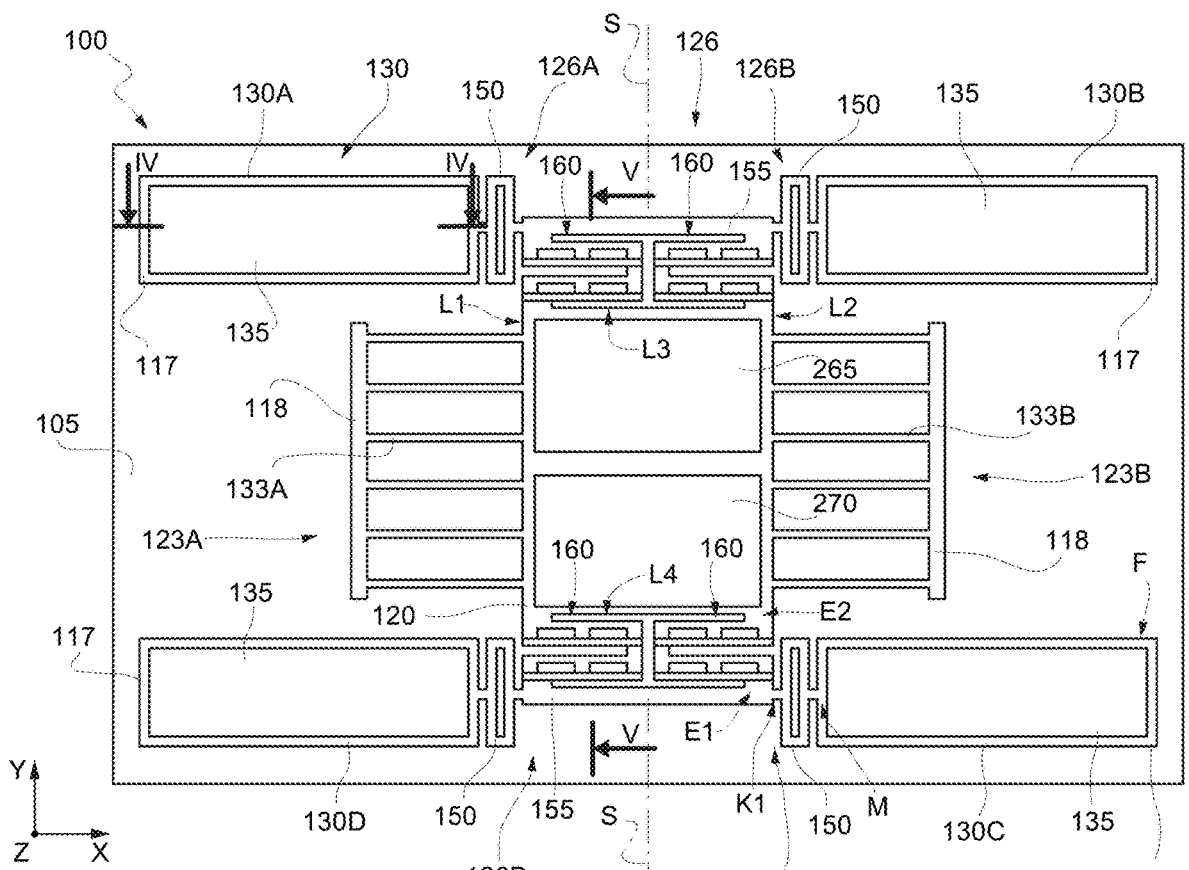
FIG. 3 shows a top plan view of the present MEMS actuator.
Figure 4:
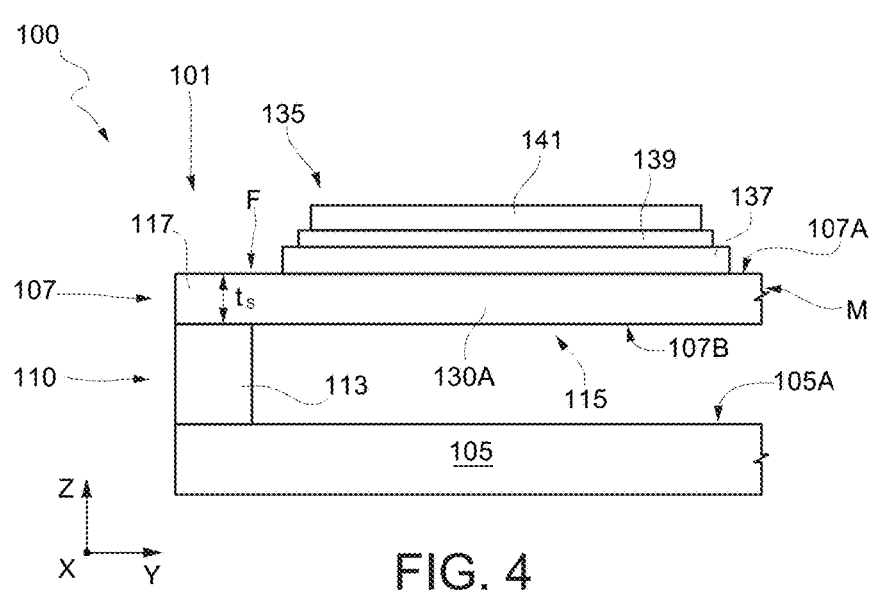
FIG. 4 is a cross-section of a detail of the MEMS actuator of FIG. 3, along the section line IV-IV of FIG. 3.
Figure 5:
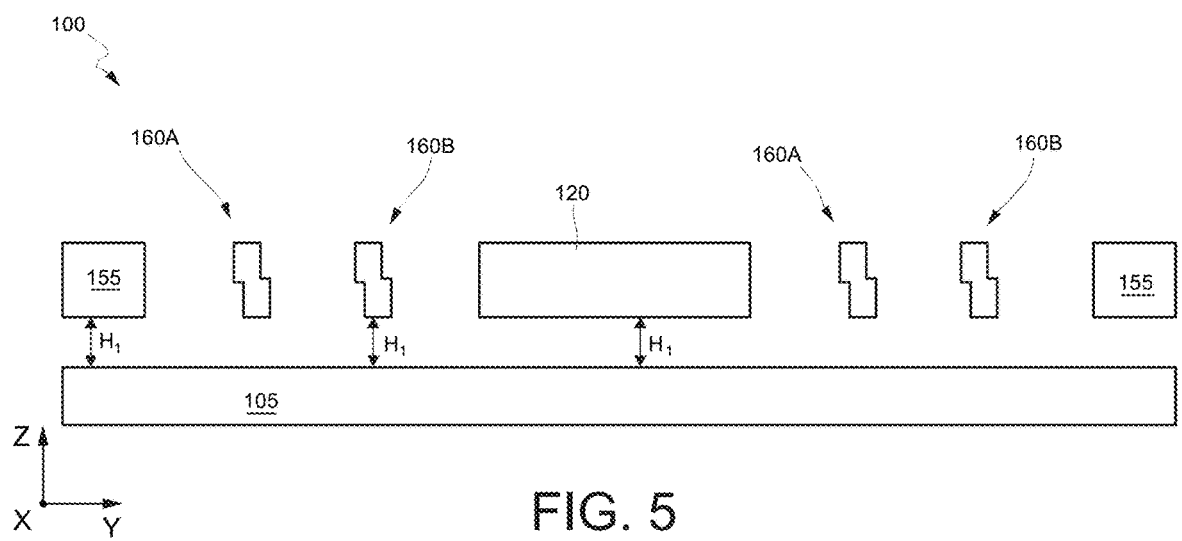
FIG. 5 is a cross-section of the MEMS actuator of FIG. 3, along the section line V-V of FIG. 3.

FIGS. 3-5 show a MEMS actuator 100 in a Cartesian reference system XYZ comprising a first axis X, a second axis Y, and a third axis Z.

In this embodiment, the MEMS actuator 100 is symmetrical with respect to a plane of symmetry S parallel to a plane YZ of the Cartesian reference system XYZ.

The MEMS actuator 100 is formed in a body 101 here comprising a substrate 105, a structural body 107, and a support body 110.

The substrate 105 has a surface 105A and is, for example, of semiconductor material, glass or plastic.

The structural body 107 has a first surface 107A and a second surface 107B and extends at a distance, along the third axis Z, from the surface 105A of the substrate 105.

The support body 110 extends between the substrate 105 and the structural body 107.

The support body 110 may be of the same material as the substrate 105 or of a different material; for example, it may be monolithic with the substrate 105 or bonded thereto.

The supporting body 110 here forms a plurality of pillars 113, one of which is visible in FIG. 4, which extend between the surface 105A of the substrate 105 and the second surface 107B of the structural body 107.

The structural body 107 is of semiconductor material, for example polysilicon, and is here formed by a single layer of semiconductor material. However, in general, the structural body 107 may be formed by one or more layers of semiconductor material stacked on top of one another.

Further, according to one embodiment, the structural body 107 may also comprise one or more layers of insulating material, for example silicon oxide, useful during manufacturing.

The structural body 107 is substantially planar and has a thickness $t_S$, along the third axis Z, comprised for example between 5 μm and 50 μm.

The structural body 107 extends over the support body 110. In particular, the second surface 107B of the structural body 107 is bonded on the pillars 113.

The structural body 107 forms a plurality of first and second anchorage regions 117, 118, which each extend over a respective pillar 113, and a suspended region 115. In practice, the first and second anchorage regions 117, 118 and the suspended region 115 are monolithic with respect to one another and formed by the same layer or stack of layers.

The first and second anchorage regions 117, 118 fix the structural body 107 to the substrate 105 and form constraint regions of the suspended region 115.

At rest, the suspended region 115 is suspended over the substrate 105 at a rest height $H_1$ (FIG. 5) measured along the third axis Z.

In the embodiment illustrated, the suspended region 115 of the structural body 107 is shaped in such a way as to form a mobile mass 120, two elastic constraint structures 123A, 123B, four transformation structures 126, and four actuation structures 130.

The mobile mass 120 has here a substantially rectangular shape in top plan view. In detail, the mobile mass 120 has a first side L1 and a second side L2, which extend parallel to the second axis Y and each have a length, along the second axis Y, comprised for example between 100 μm and 4 mm, in particular of 2 mm. Furthermore, the mobile mass 120 has a third side L3 and a fourth side L4, which extend parallel to the first axis X and have a length, along the first axis X, comprised for example between 100 μm and 4 mm, in particular of 1 mm.

In this embodiment, the elastic constraint structures 123A, 123B are formed, respectively, by a plurality of first coupling elements 133A, which extend parallel to the first axis X, on the first side L1 of the mobile mass 120, and by a plurality of second coupling elements 133B, which extend parallel to the first axis X, on the second side L2 of the mobile mass 120.

In detail, the first coupling elements 133A each extend, along the first axis X, between the first side L1 of the mobile mass 120 and a respective second anchorage region 118.

The second coupling elements 133B each extend, along the first axis X, between the second side L2 of the mobile mass 120 and a respective second anchorage region 118.

In detail, here, the first coupling elements 133A are equal to the second coupling elements 133B and are symmetrical to the second coupling elements 133B with respect to the symmetry plane S.

The first and second coupling elements 133A, 133B are compliant along the second axis Y and are rigid along the first axis X and the third axis Z. For this purpose, in this embodiment, the first and second coupling elements 133A, 133B each have a width along the second axis Y that is smaller than the respective thickness $t_S$, along the third axis Z, and of a respective length, along the first axis X.

The actuation structures 130 each have a fixed end F, which is fixed to a respective first anchorage region 117, and a free end M, which is coupled to a respective transformation structure 126.

The actuation structures 130 comprise a first actuation structure 130A, a second actuation structure 130B, a third actuation structure 130C, and a fourth actuation structure 130D, which are each arranged at a respective corner of the mobile mass 120.

The first, second, third, and fourth actuation structures 130A-130D each extend in a direction parallel to the first axis X between the respective fixed end F and the respective free end M.

The first, second, third, and fourth actuation structures 130A-130D each form a cantilever beam having a length, measured along the first axis X, comprised for example between 500 μm and 4 mm, and a length, measured along the second axis Y, comprised for example between 100 μm and 2 mm.

The MEMS actuator 100 comprises a plurality of piezoelectric actuation elements 135, which each extend over a respective actuation structure 130, on the first surface 107A of the structural body 107.

In this embodiment, the piezoelectric actuation elements 135 each occupy substantially a same area, in a plane XY of the Cartesian reference system XYZ, of the respective actuation structure 130; i.e., they each extend approximately throughout the length, along the first axis X and along the second axis Y, of the respective actuation structure 130.

The piezoelectric actuation elements 135 are capacitor structures each comprising a stack formed by a bottom electrode 137, which extends over the first surface 107A of the structural body 107, a piezoelectric region 139 directly arranged on the bottom electrode 137, and a top electrode 141 directly arranged on the piezoelectric region 139.

The bottom electrode 137 and the top electrode 141 may each be formed by one or more layers of conductive material.

The piezoelectric region 139 is a thin layer of piezoelectric material, for example lead zirconate titanate (PZT), $BaTiO_3$, KNN (sodium and potassium niobate), $PbTiO_2$, or $PbNb_2O_6$, having a thickness comprised for example between 0.5 μm and 5 μm.

The bottom electrode 137 and the top electrode 139 are electrically coupled to a bias circuit by specific electrical connection tracks, here not illustrated.

The transformation structures 126 each extend between the mobile end M of a respective actuation structure 130 and the mobile mass 120.

The transformation structures 126 comprise a first transformation structure 126A, a second transformation structure 126B, a third transformation structure 126C, and a fourth transformation structure 126D.

Here, the first transformation structure 126A extends between the free end M of the first actuation structure 130A and a respective portion of the third side L3 of the mobile mass 120. The second transformation structure 126B extends between the free end M of the second actuation structure 130B and a respective portion of the third side L3 of the mobile mass 120. The third transformation structure 126C extends between the free end M of the third actuation structure 130C and a respective portion of the fourth side L4 of the mobile mass 120. The fourth transformation structure 126D extends between the free end M of the third actuation structure 130D and a respective portion of the fourth side L4 of the mobile mass 120.

In detail, the transformation structures 126A-126D each comprise an elastic decoupling structure 150 and an elastic conversion structure 160. The transformation structures 126A-126D further comprise two stiffening structures 155, which here extend parallel to the first axis X, alongside the mobile mass 120. In particular, in this embodiment, the first and second transformation structures 126A, 126B share a same stiffening structure 155, and the third and fourth transformation structures 126C, 126D share a same stiffening structure 155.

Each elastic decoupling structure 150 has a first end coupled to the free end M of the respective actuation structure 130 and a second end coupled to an end K1 of a respective stiffening structure 155.

Figure 6:
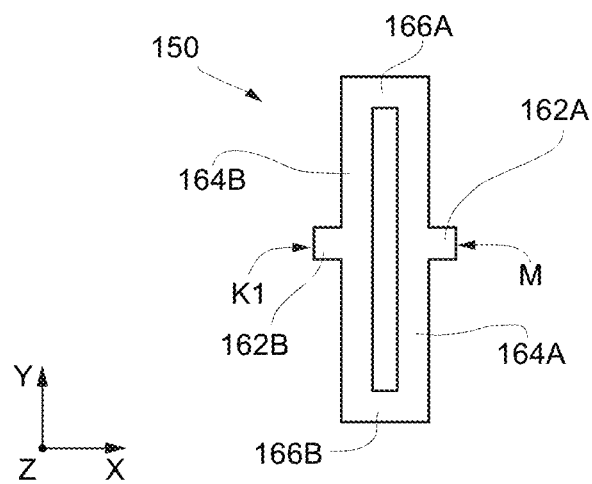
FIG. 6 shows a top plan view of another enlarged detail of the MEMS actuator of FIG. 3.

As illustrated in FIG. 6, in this embodiment, each elastic decoupling structure 150 forms a loop-like closed structure.

In detail, the decoupling structure 150 comprises a first coupling portion 162A and a second coupling portion 162B, a first primary arm 164A and a second primary arm 164B, and a first secondary arm 166A and a second secondary arm 166B.

The first and second primary arms 164A, 164B extend at a mutual distance in a direction parallel to the first axis X and each have a rectangular aspect ratio. The first and second primary arms 164A, 164B each have a length measured along the second axis Y that is greater than a respective length measured along the first axis X.

The first and second secondary arms 166A, 166B each extend in a direction parallel to the first axis X between a respective end of the first primary arm 164A and a respective end of the second primary arm 164B. The first and second secondary arms 166A, 166B have a length measured along the first axis X that is smaller than the length of the first and second primary arms 164A, 164B, measured along the second axis Y.

The first coupling portion 162A extends in a direction parallel to the first axis X between the free end M of the respective actuation structure 130 and the first primary arm 164A, in particular to a median portion of the first primary arm 164A.

The second coupling portion 162B extends in a direction parallel to the first axis X between the end K1 of the respective stiffening structure 155 and the second primary arm 164B, in particular to a median portion of the second primary arm 164B.

The stiffening structure 155 extends between and mechanically couples together the respective decoupling structure 150 and the respective elastic conversion structure 160.

In this embodiment, the stiffening structure 155 extends in a direction parallel to the first axis X and has a rectangular shape in top plan view.

The description of the elastic conversion structures 160 refers to the elastic transformation elements described in Italian Patent Application No. 102020000003868, filed on Feb. 25, 2020, the content of which is incorporated by reference in its entirety.

The elastic conversion structures 160 of the first, second, third, and fourth transformation structure 126A-126D are substantially equal to one another and translated in the plane XY. In detail, the elastic conversion structure 160 of the first transformation structure 126A is symmetrical to the elastic conversion structure 160 of the second transformation structure 126B with respect to the symmetry plane S and is equal and translated along the second axis Y with respect to the elastic conversion structure 160 of the fourth transformation structure 126D. The elastic conversion structure 160 of the third transformation structure 126C is symmetrical to the elastic conversion structure 160 of the fourth transformation structure 126D with respect to the symmetry plane S and is equal and translated along the second axis Y with respect to the elastic conversion structure 160 of the second transformation structure 126B.

The elastic conversion structures 160 each extend between a respective first connection end E1, coupled to the respective stiffening structure 155, and a respective second connection end E2, coupled to the mobile mass 120, in particular, here, to a respective corner of the mobile mass 120.

The elastic conversion structures 160 are compliant in a direction parallel to the second axis Y and to the third axis Z, and are rigid in a direction parallel to the first axis X.

Figure 7:
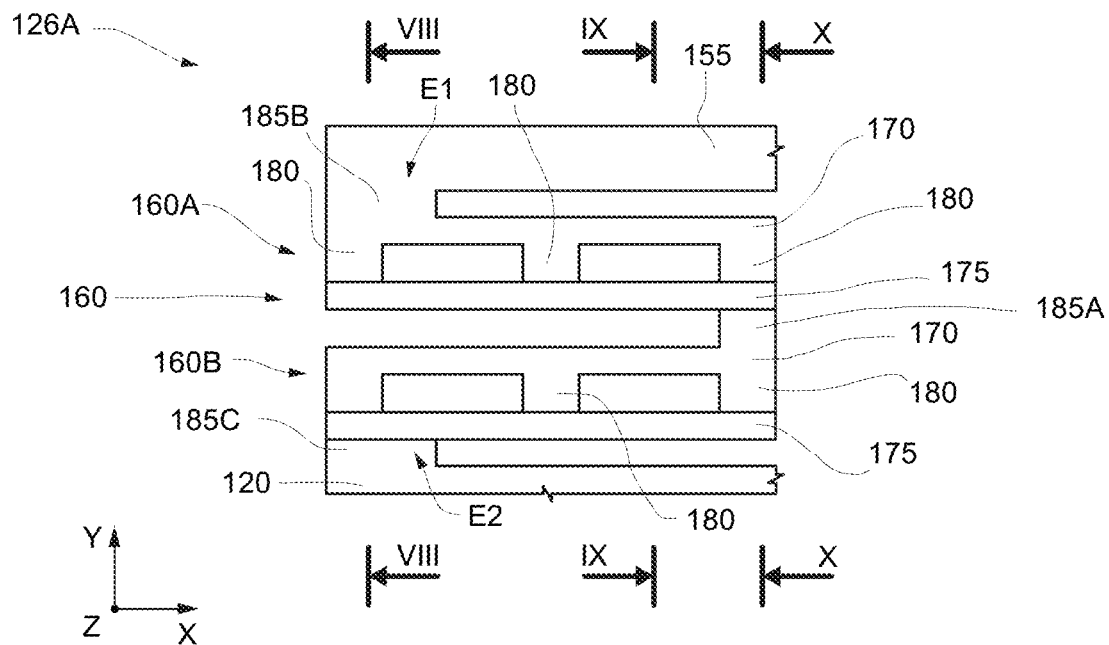
FIG. 7 shows a top plan view of a further enlarged detail of the MEMS actuator of FIG. 3.

As illustrated by way of example in FIG. 7 for the first transformation structure 126A, the elastic conversion structures 160 are each formed by a respective first portion 160A and a respective second portion 160B, which are equal to one another and translated along the second axis Y with respect to one another. In practice, the elastic conversion structures 160 have, in top plan view, a folded structure.

The first and the second portions 160A, 160B of the conversion structures 160 comprise a respective top elongated portion 170 and a respective bottom elongated portion 175, which have, at rest, an elongated shape extending in a direction parallel to the first axis X.

Figure 8:
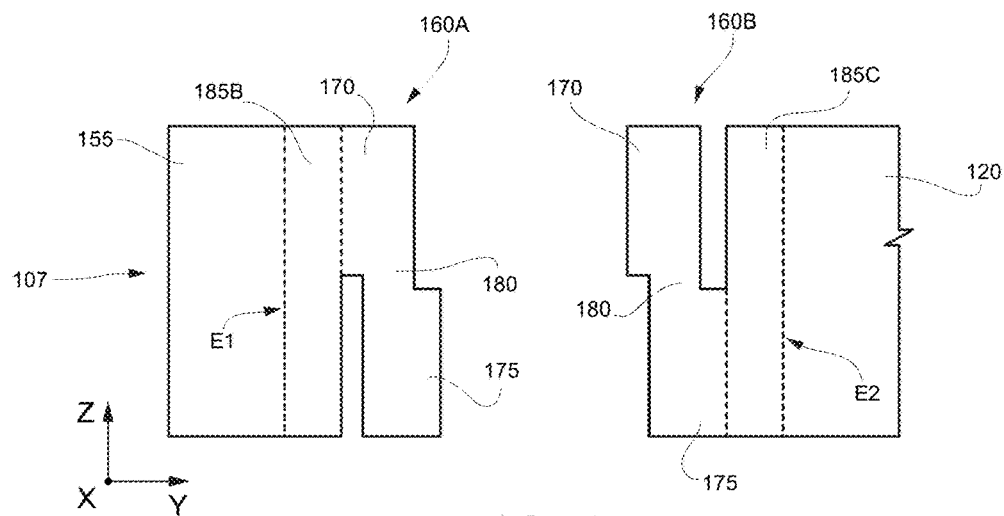
FIG. 8 is a cross-section of the detail of FIG. 7, along the section line VIII-VIII of FIG. 7.
Figure 9:
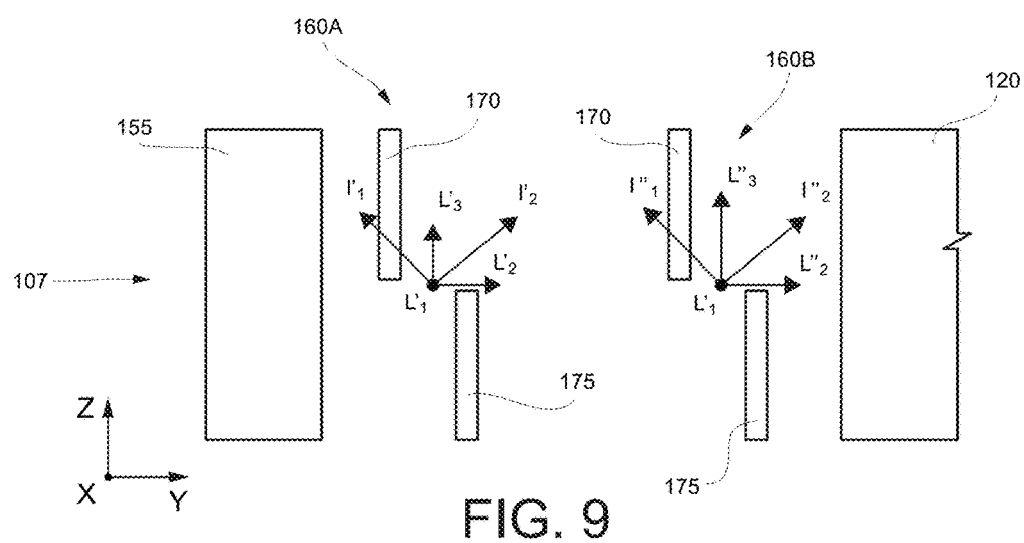
FIG. 9 is a cross-section of the detail of FIG. 7, along the section line IX-IX of FIG. 7.
Figure 10:
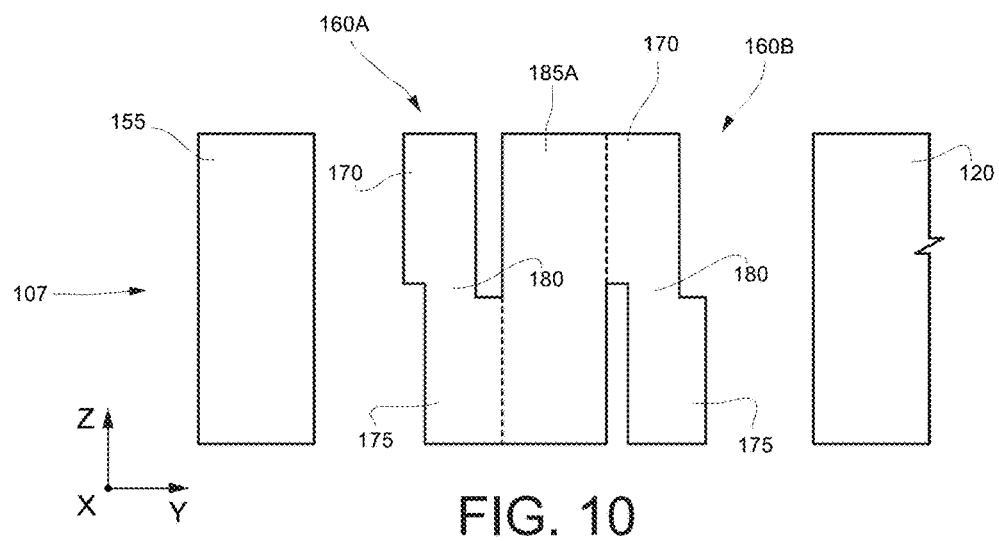
FIG. 10 is a cross-section of the detail of FIG. 7, along the section line X-X of FIG. 7.

As may be seen in the cross-sections of FIGS. 8-10, the top elongated portion 170 and the bottom elongated portion 175 are arranged at a distance along the second axis Y and at a different height along the third axis Z.

In detail, considering the orientation represented of the MEMS actuator 100, with the structural body 107 arranged over the support body 110 and the substrate 105, the top elongated portion 170 is arranged over the bottom elongated portion 175.

The first and second portions 160A, 160B of the conversion structures 160 also comprise transverse portions 180 extending between each top elongated portion 170 and the respective bottom elongated portion 175.

The number and spacing of the transverse portions 180 may be chosen according to the desired elasticity for the elastic conversion structures 160. In any case, the presence of a number of transverse portions 180 enables mechanical coupling of the corresponding top and bottom elongated portions 170, 175 and thus helps prevents them from deforming in an independent way.

In addition, the elastic conversion structures 160 each comprise a first connection portion 185A, a second connection portion 185B, and a third connection portion 185C.

The first connection portion 185A couples the respective first and second portions 160A, 160B. In detail, the first connection portion 185A extends between, and is coupled to, a first end of the bottom elongated portion 175 of the first portion 160A and a first end of the top elongated portion 170 of the second portion 160B.

The second connection portion 185B is coupled to a second end of the top elongated portion 170 of the first portion 160A, and the third connection portion 185C is coupled to a second end of the bottom elongated portion 175 of the second portion 160B.

In detail, in the first and second transformation structures 126A, 126B, the second connection portion 185B forms the first connection end E1 and connects the elastic conversion structure 160 to the respective stiffening structure 155, and the third connection portion 185C forms the second connection end E2 and connects the elastic conversion structure 160 to the mobile mass 120.

Instead, in the third and fourth transformation structures 126C, 126D, the second connection portion 185B forms the second connection end E2 and connects the respective elastic conversion structure 160 to the mobile mass 120, and the third connection portion 185C forms the first connection end E1 and connects the respective elastic conversion structure 160 to the respective stiffening structure 155.

The cross-section of FIG. 9 shows a first triplet of local Cartesian axes $L_1$, $L_2$, $L_3$, comprising a first local axis $L_1$, a second local axis $L_2$, and a third local axis $L_3$, and a second triplet of local Cartesian axes $L'_1$, $L'_2$, $L'_3$, comprising a first local axis $L'_1$, a second local axis $L'_2$, and a third local axis $L'_3$.

The first local axes $L_1$, $L'_1$, the second local axes $L_2$, $L'_2$, and the third local axes $L_3$, $L'_3$ are parallel, respectively, to the first, the second, and the third axes X, Y, Z of the system of Cartesian axes XYZ.

In detail, the first triplet of local Cartesian axes $L_1$, $L_2$, $L_3$ has an origin centered in the barycenter of the section of the first portion 160A of the conversion structure 160 illustrated in FIG. 9. The second triplet of local Cartesian axes $L'_1$, $L'_2$, $L'_3$ has an origin centered in the barycenter of the section of the second portion 160B of the conversion structure 160 illustrated in FIG. 9.

FIG. 9 also shows the principal axes of inertia $I'_1$, $I'_2$ of the section of the first portion 160A of the conversion structure 160 and the principal axes of inertia $I''_1$, $I''_2$ of the section of the second portion 160B of the conversion structure 160.

The principal axes of inertia $I'_1$, $I'_2$ are transverse with respect to the second local axis $L_2$ and the third local axis $L_3$ of the first portion 160A of the conversion structure 160, and the principal axes of inertia $I''_1$, $I''_2$ are transverse with respect to the second local axis $L'_2$ and the third local axis $L'_3$ of the second portion 160B of the conversion structure 160.

In this embodiment, for each cross-section (taken in a direction parallel to the plane YZ) of the first and second portions 160A, 160B of the elastic conversion structure 160, the principal axes of inertia $I''_1$, $I''_2$, $I'_1$, $I'_2$ have the same orientation.

Further, for each cross-section of the first and second portions 160A, 160B of the elastic conversion structure 160, it is possible to calculate a centrifugal moment of inertia $I_C$, with respect to a corresponding pair of local axes formed by the second and third local axes $L_2$, $L_3$ for the first portion 160A and by the second and third local axes $L'_2$, $L'_3$ for the second portion 160B by the integral:

$$I_C = \iint r_1 r_2 \, dA,$$

wherein $r_1$ and $r_2$ are the distances of each point of the section, respectively from the second and third local axes $L_2$, $L_3$, for the first portion 160A and from the second and third local axes $L'_2$, $L'_3$ for the second portion 160B, and dA is the unit of area of the section.

The centrifugal moment of inertia $I_C$ is nonzero since the second and third local axes $L_2$, $L_3$ and the second and third local axes $L'_2$, $L'_3$ are not axes of symmetry of the cross-section of the first portion 160A and of the second portion 160B, respectively, and thus do not coincide with the respective principal axes of inertia $I'_1$, $I'_2$, and $I''_1$, $I''_2$.

This entails that a force applied in a direction transverse with respect to the first principle axis of inertia $I'_1$, $I'_2$ or to the second principle axis of inertia $I''_1$, $I''_2$ causes a skew bending of the corresponding section of the elastic conversion structure 160.

That is, for example, that a force applied parallel to the third local axis $L_3$ causes a consequent deformation both along the third local axis $L_3$ and along the second local axis $L_2$. In other words, a force applied to the elastic conversion structure 160 parallel to the third axis Z causes a deformation both parallel to the third axis Z and parallel to the second axis Y of the system of Cartesian coordinates XYZ.

In use, when it is desired to move the mobile mass 120, a bias voltage is applied between the top electrode 141 and the bottom electrode 137 (FIG. 4) of the piezoelectric actuation elements 135, in particular of all the piezoelectric actuation elements 135.

Figure 11:
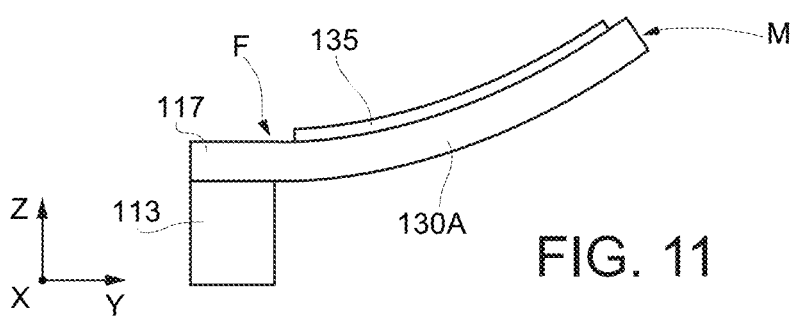
FIG. 11 is a schematic illustration of the detail of FIG. 4, in use.

If the bias voltage is different from zero, it causes a deformation of the piezoelectric region 139 and thus of the corresponding actuation structure 130 integral thereto, as illustrated in FIG. 11 for the first actuation structure 130A.

In detail, each actuation structure 130 bends in a direction transverse with respect to the plane XY. For each actuation structure 130, the fixed end F does not move, since it is constrained to the respective first anchorage region 117 of the structural body 107, while the free end M bends upwards. In particular, the free end M translates upwards, along the third axis Z, and undergoes a rotation about an axis parallel to the first axis X.

The decoupling structure 150, which is constrained to the mobile end M of the actuation structure 130, is thus displaced upwards.

Consequently, also the stiffening structure 155, which, through the decoupling structures 150, is constrained at its ends to two actuation structures 130 that turn in opposite directions, displaces upwards, along the third axis Z, but does not turn.

In fact, the decoupling structure 150 undergoes a deformation and allows neutralization of, at its end K1, the rotation of the free end M of the actuation structure 130.

In other words, the end K1 of each decoupling structure 150 translates upwards, but does not turn.

The translation of the stiffening structures 155 also causes a translation upwards, along the third axis Z, of the first connection ends E1 of the elastic conversion structures 160. Associated with this translation is a vertical force, parallel to the third axis Z.

To a first approximation, the vertical force does not cause a skew bending at the first connection ends E1, since they are fixed with respect to the stiffening structures 155.

Instead, a local force acts on intermediate portions of the elastic conversion structures 160 that are not constrained to the stiffening structures 155, depending upon the vertical force and s parallel thereto.

Figure 12:
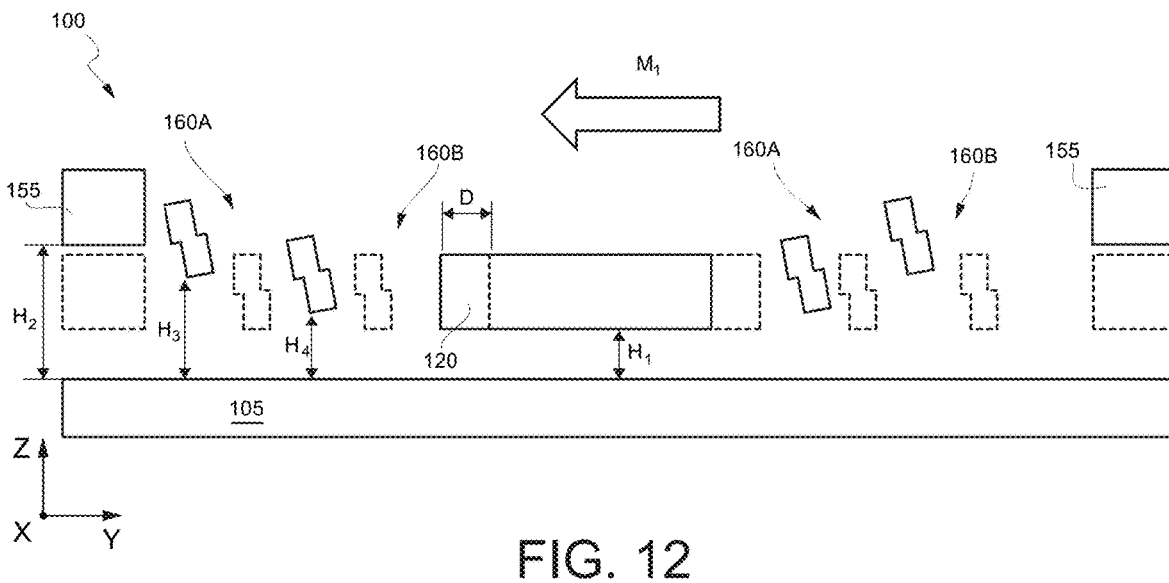
FIG. 12 shows the cross-section of FIG. 5 of the MEMS actuator of FIG. 3, in use.

Consequently, said intermediate portions are subjected to skew bending, as illustrated in FIG. 12.

In FIG. 12, for reasons of clarity, the stiffening structure 155, the mobile mass 120, and the elastic conversion structures 160 are represented by a solid line to indicate the respective position in use, in a condition of actuation, and by a dashed line to indicate the respective rest position.

In condition of actuation, the stiffening structure 155 is arranged at a work height $H_2$, with respect to the substrate 105, greater than the rest height $H_1$.

The work height $H_2$ may be modified by varying the value of the bias voltage. Furthermore, the work height $H_2$ depends upon the geometrical and structural parameters of the actuation structure 130 and of the piezoelectric actuation elements 135, for example material and size, which may be established in the design stage, on the basis of the requirements of a specific application.

In particular, the skew bending of each intermediate portion undergoes, with respect to the substrate 105: i) a translation parallel to the axis Z; ii) a translation parallel to the axis Y; and iii) a rotation in the plane YZ.

However, to a first approximation, the local force that acts on the second connection end E2 of the elastic conversion structures 160 (FIG. 7) does not cause translation parallel to the axis Z, since the mobile mass 120 is mechanically coupled to the coupling elements 133A, 133B (FIG. 3), which are rigid with respect to movements parallel to the third axis Z.

The second connection end E2 of each elastic conversion structure 160 thus translates parallel to the second axis Y, along a first movement direction $M_1$, schematically represented by an arrow in FIG. 12. Consequently, also the mobile mass 120 translates parallel to the second axis Y, along the first movement direction $M_1$.

To a first approximation, the mobile mass 120 thus remains, in use, at the rest height $H_1$ with respect to the substrate 105.

In fact, the mobile mass 120 undergoes a vertical translation, along the third axis Z, much smaller than its thickness $t_S$, for example less than 3 µm, in view of a high horizontal translation, along the second axis Y, for example greater than 50 µm.

Further, again with reference to FIG. 12, the intermediate portions of the first portion 160A of the conversion structures 160 are at a first intermediate height $H_3$ with respect to the substrate 105 that is smaller than the work height $H_2$. The intermediate sections of the second portion 160B of the conversion structures 160 are at a second intermediate height $H_4$ with respect to the substrate 105 that is smaller than the first intermediate height $H_3$ and greater than the rest height $H_1$.

At the same time, still with reference to FIG. 12, the intermediate portions of the first portion 160A of the conversion structures 160 undergo a translation, parallel to the second axis Y, along the first movement direction $M_1$, that is smaller than the translation, parallel to the second axis Y, of the intermediate portions of the second portion 160B of the conversion structures 160.

In practice, the elastic conversion structures 160 convert a vertical translation, for example comprised between 1 µm and 200 µm, out of the plane, i.e., along the axis Z, of the actuation structures 130, into a horizontal translation, for example comprised between 1 µm and 200 µm, in particular greater than 50 µm, in plane, i.e., along the second axis Y, of the mobile mass 120.

The MEMS actuator 100 thus allows, in view of a D.C. bias voltage, comprised, for example, between 0 V and 65 V, to obtain a large in-plane translation of the mobile mass 120. In addition, by applying a voltage variable from zero to a maximum value, and vice versa, it is possible to obtain a gradual continuous movement of the mobile mass 120 from the rest position (with solid line in FIG. 12) to that of maximum elongation, and back.

Figure 13:
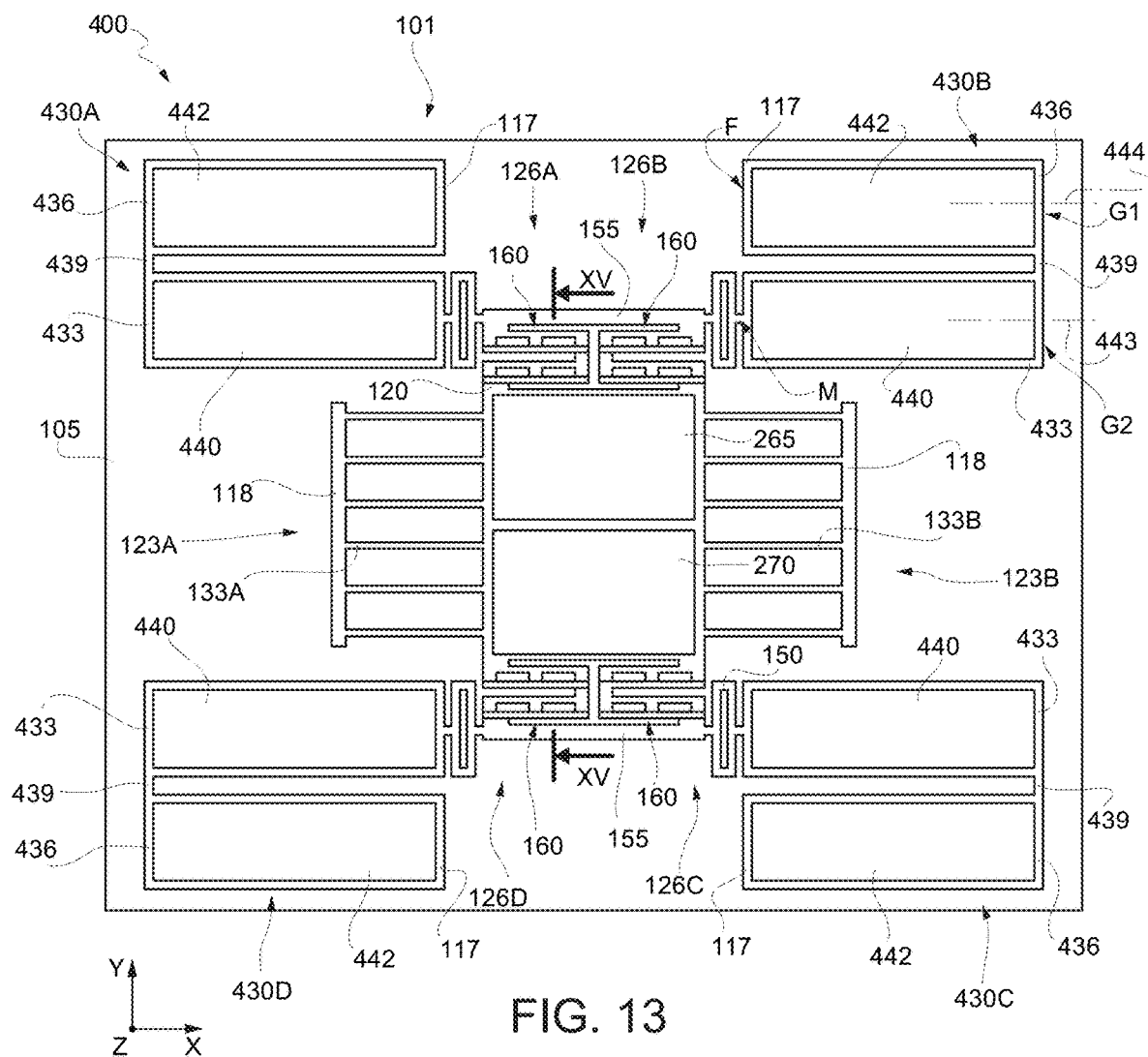
FIG. 13 shows a top plan view of the present MEMS actuator, according to a different embodiment.

FIG. 13 shows a different embodiment of the present MEMS actuator, here designated by 400.

The MEMS actuator 400 has a general structure similar to the MEMS actuator 100 of FIG. 3; consequently, elements in common are designated by the same reference numbers and are not described any further.

The MEMS actuator 400 is formed in the body 101, which also here comprises the substrate 105, the structural body 107, and the support body 110.

The suspended region 115 of the structural body 107 here also forms the mobile mass 120, the constraint structures 123A, 123B, the transformation structures 126A-126D, and actuation structures, here designated by 430A-430D. Consequently, also here these structures are monolithic with respect to one another and to the first and second anchorage regions 117, 118.

Also here, each transformation structure 126A-126D includes a respective decoupling structure 150 and a respective elastic conversion structure 160. Also here, the suspended region 115 forms the stiffening structures 155.

Furthermore, also here four actuation structures are present, referred to hereinafter as first, second, third, and fourth actuation structures 430A-430D.

In this embodiment, the actuation structures 430A-430D each comprise an upward-actuation structure 433, a downward-actuation structure 436, and a junction portion 439, which couples the upward-actuation structure 433 and the downward-actuation structure 436 of each actuation structure 430A-430D.

Each downward-actuation structure 436 has an elongated shape, with a fixed end F, which is constrained to a respective first anchorage region 117, and a junction end G1, opposite to the fixed end F.

Each downward-actuation structure 436 extends along the first axis X between its own fixed end F and its own junction end G1, here having a rectangular shape in top plan view.

Each upward-actuation structure 433 also has an elongated shape, with a junction end G2 that is coupled to the junction end G1 of the respective downward-actuation structure 436 by the respective junction structure 439, and a free end M that is coupled to a respective decoupling structure 150.

Each upward-actuation structure 433 extends in a direction parallel to the first axis X between its own junction end G2 and its own free end M, here having a rectangular shape in top plan view.

In practice, the upward-actuation structures 433 and the downward-actuation structures 436 are equal to one another, and each upward-actuation structure 433 extends alongside and parallel to a respective downward-actuation structure 436.

The MEMS actuator 400 further comprises a plurality of upward-actuation piezoelectric elements 440 and a plurality of downward-actuation piezoelectric elements 442, carried, respectively, by the upward-actuation structures 433 and the downward-actuation structures 436, in particular on the first surface 107A of the structural body 107.

The upward-actuation piezoelectric elements 440 and the downward-actuation piezoelectric elements 442 are equal to one another and to the piezoelectric actuation elements 135 of the MEMS actuator 100 of FIG. 3.

The upward-actuation piezoelectric elements 440 and the downward-actuation piezoelectric elements 442 are electrically coupled to respective bias circuits, not illustrated herein, by first connection tracks 443 and second connection tracks 444, respectively, which enable distinct biasing thereof. The first and second connection tracks 443, 444 are schematically represented, for simplicity, by a respective dashed line in FIG. 13.

In use, in a first operating condition, a first bias voltage, with respect to a reference voltage, for example ground, is applied to the upward-actuation piezoelectric elements 440, while the downward-actuation piezoelectric elements 442 are kept at the reference voltage.

In a way similar to what has been discussed above, the first bias voltage causes a deformation, in particular a bending, of the upward-actuation structures 433. In detail, the upward-actuation structures 433 are each constrained to a respective first anchorage region 117 by the respective junction structure 439 and the respective downward-actuation structure 436. Consequently, the junction ends G2 of the upward-actuation structures 433 do not move, whereas the free ends M move, similarly to that discussed with reference to FIG. 11. The free ends M move in an ascent direction along the third axis Z, in particular upwards.

Consequently, the decoupling structures 150 and the stiffening structures 155 also translate in the ascent direction and, as described above and illustrated in FIG. 12, the mobile mass 120 undergoes a translation in the first movement direction $M_1$, parallel to the second axis Y.

In a second operating condition, a second bias voltage, with respect to the reference voltage, is applied to the downward-actuation piezoelectric elements 442, while the upward-actuation piezoelectric elements 440 are kept at the reference voltage.

Figure 14:
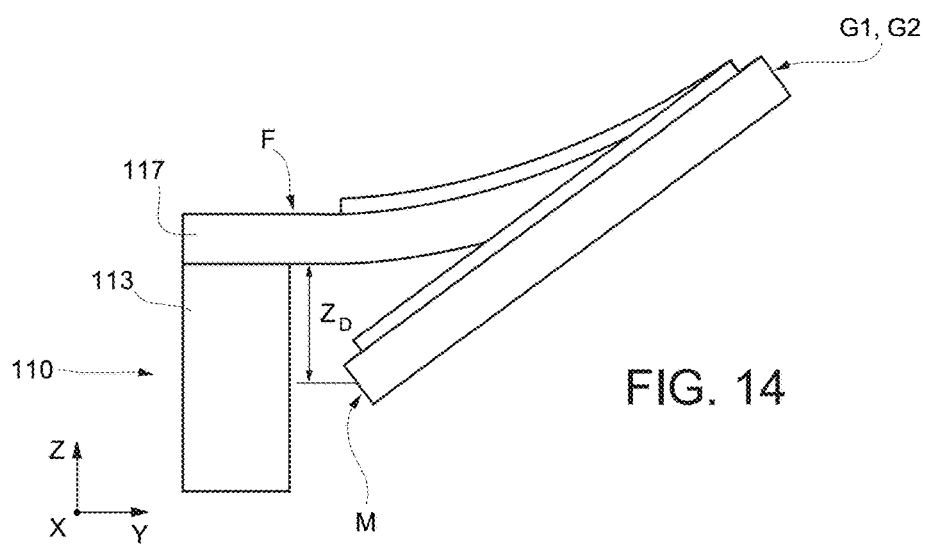
FIG. 14 is a schematic cross-section of a detail of the MEMS actuator of FIG. 13, in use, in an operating condition.

As illustrated in FIG. 14, the second bias voltage causes a deformation, in particular a bending, of the downward-actuation piezoelectric elements 442 and thus of the downward-actuation structures 436, integral thereto.

In detail, in each downward-actuation structure 436, the fixed end F does not move, since it is constrained to the respective first anchorage region 117, and the junction end G1 turns (in FIG. 14 in a counter-clockwise direction), moving upwards.

Consequently, the junction end G2 of the respective upward-actuation structure 433 also moves upwards, rotating.

Given that the upward-actuation structure 433 remains undeformed and maintains a rectilinear profile, it turns, bringing its own free end M downwards.

In practice, the free ends M of the upward-actuation structures 433 lower, along the third axis Z, with respect to the rest position, approaching the substrate 105. The free ends M thus each move to a distance $Z_D$ from the respective fixed end F, along the third axis Z. For instance, the distance $Z_D$ may be comprised between 1 μm and 200 μm.

Consequently, also the respective decoupling structure 150 and the respective stiffening structure 155 move downwards, along the third axis Z.

Figure 15:
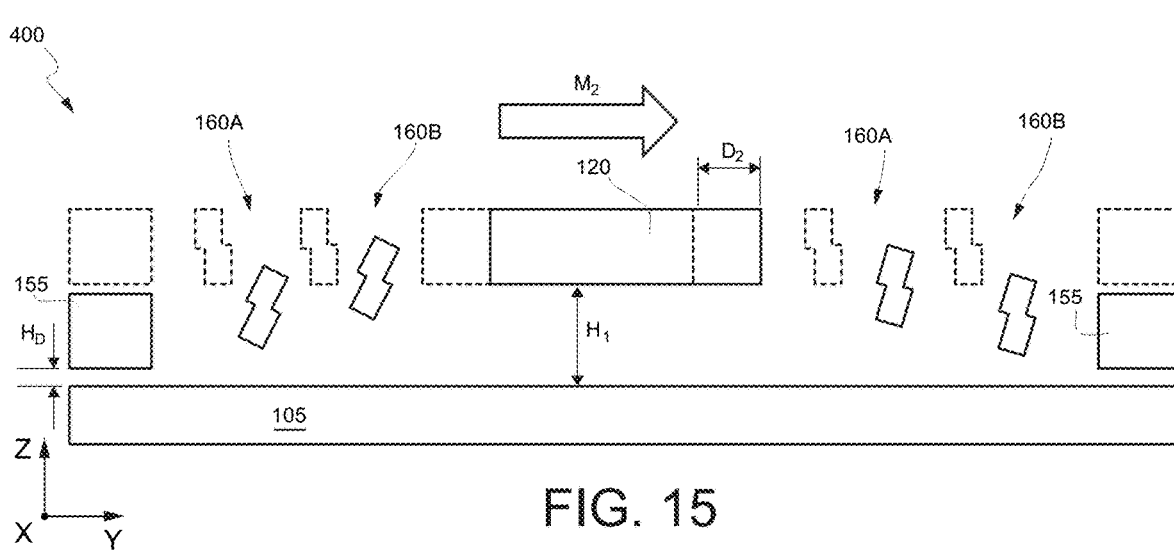
FIG. 15 is a cross-section of the MEMS actuator of FIG. 13, in use, along the section line XV-XV of FIG. 13, in the operating condition of FIG. 14.

As illustrated in FIG. 15, the stiffening structures 155 move to a work descent distance $H_D$ from the substrate 105 smaller than the rest distance $H_1$.

For reasons of clarity, in FIG. 15, the stiffening structures 155, the mobile mass 120, and the elastic conversion structures 160 are represented by a solid line to indicate the respective position in the second operating condition, and with a dashed line to indicate the respective rest position.

The lowering of the stiffening structures 155 generates a vertical downward force, which is parallel to the third axis Z and oriented towards the substrate 105; i.e., the vertical downward force is opposite to the work force generated in the first operating condition discussed above.

The vertical downward force is thus, also in the second operating condition, transverse with respect to the main axes of inertia of the sections of the elastic conversion structures 160 (FIG. 9), but opposite with respect to the vertical upward force. The vertical downward force thus causes a corresponding skew bending of the intermediate portions of the elastic conversion structures 160 such that each intermediate section undergoes a translation parallel to the third axis Z, a translation parallel to the second axis Y, and a rotation in the plane YZ, each having a direction opposite to what is described with reference to FIG. 12.

In detail, the intermediate portions of the first and second portions 160A, 160B of the elastic conversion structures 160 translate, along the third axis Z, towards the substrate 105 and, in a direction parallel to the second axis Y, in a second movement direction $M_2$ (represented schematically by an arrow in FIG. 15), which is opposite to the first movement direction $M_1$ of FIG. 12.

Consequently, the mobile mass 120 (which is not able to move parallel to the third axis Z, i.e., perpendicular to the plane in which it lies because of the constraint structures 123A, 123B) also undergoes a translation parallel to the second axis Y, in the second movement direction $M_2$.

In practice, the MEMS actuator 400 allows movement of the mobile mass 120 parallel to the second axis Y, in two opposite directions, even though the piezoelectric regions 139 of the first and second piezoelectric actuation elements 440, 442 are of a same piezoelectric material, such as PZT, which is subjected to a tensile stress, irrespective of the direction of the applied bias voltage.

Figure 16:
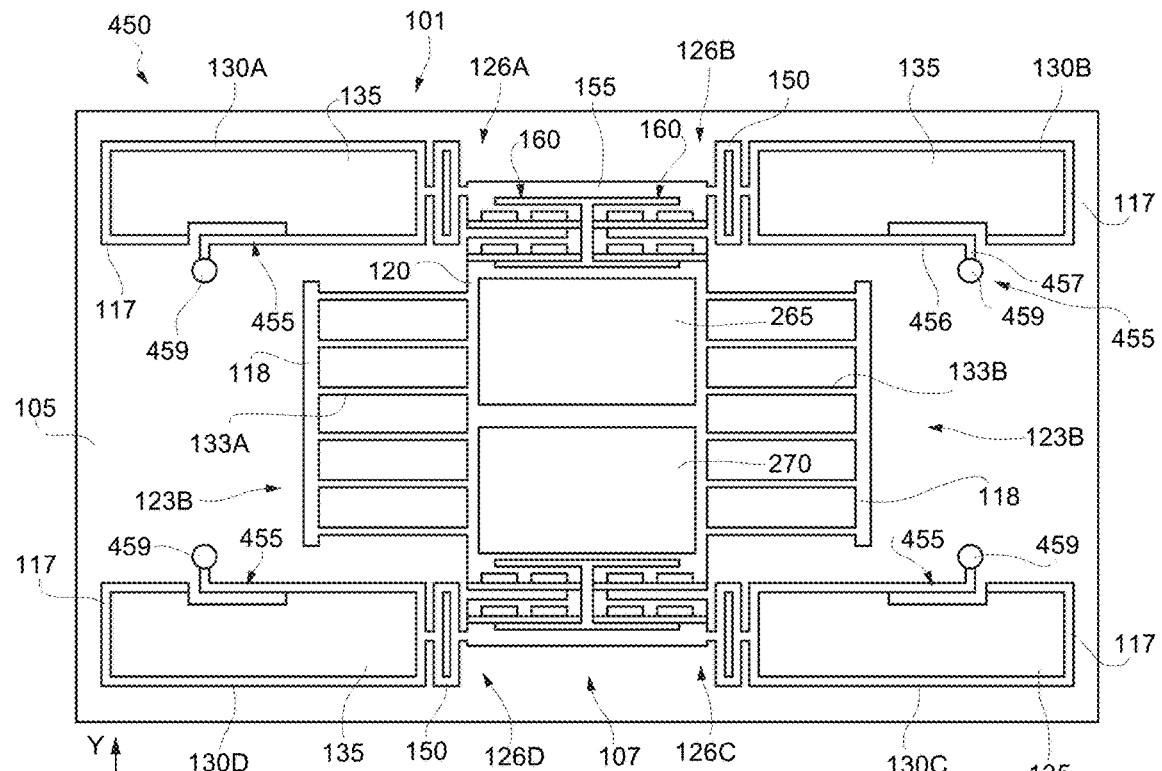
FIG. 16-18 each show a top plan view of the present MEMS actuator, according to a respective embodiment.

FIG. 16 shows a different embodiment of the present MEMS actuator, here designated by 450. The MEMS actuator 450 has a general structure similar to that of the MEMS actuator 100 of FIG. 3; consequently, elements in common are designated by the same reference numbers and are not described any further.

The MEMS actuator 450 is formed in the body 101 comprising the substrate 105, the structural body 107, and the support body 110, not illustrated herein.

The suspended region 115 of the structural body 107 here also forms the mobile mass 120, the constraint structures 123A, 123B, the transformation structures 126A-126D, and the actuation structures 130A-130D. Consequently, here these structures are also monolithic with respect to one another and to the first and second anchorage regions 117, 118.

In this embodiment, the structural body 107 also forms third anchorage regions 459.

In this embodiment, the MEMS actuator 450 also comprises a set of detection elements 455, one for each actuation structure 130A-130D.

The detection elements 455 are each formed by a piezoresistive sensor, formed in the suspended region 115 of the structural body 107.

Here, the detection elements 455 are L-shaped in top plan view and each comprise a first end coupled to a respective third anchorage region 459 and a second end coupled to the respective actuation structure 130A-130D.

In the embodiment illustrated, each detection element 455 has a first arm 456, which extends along a side of the respective actuation structure 130A-130D, and a second arm 457, which is transverse, in particular perpendicular, with respect to the first arm 456 and coupled to the respective third anchorage portion 459.

Each detection element 455 has, at rest, a rest electrical resistance.

In use, deformation of the actuation structures 130A-130D generates a mechanical stress in the detection elements 455. The mechanical stress modifies the rest electrical resistance.

Specific electrical connections, here not illustrated, connect the detection elements 455 to an external measurement circuit, configured to measure the level of variation of the rest electrical resistance. By comparing this variation of resistance with tables obtained during calibration, it is possible to convert the variation of resistance into a level of deformation of the actuation structures 130A-130D and/or of displacement of the mobile mass 120. This level of deformation may be compared with desired values of deformation of the actuation structures 130A-130D and/or of movement of the mobile mass 120.

In practice, the MEMS actuator 450 is able to provide a closed-loop control system for controlling displacement of the mobile mass 120. The MEMS actuator 450 thus enables better control of the translation of the mobile mass 120.

Figure 17:
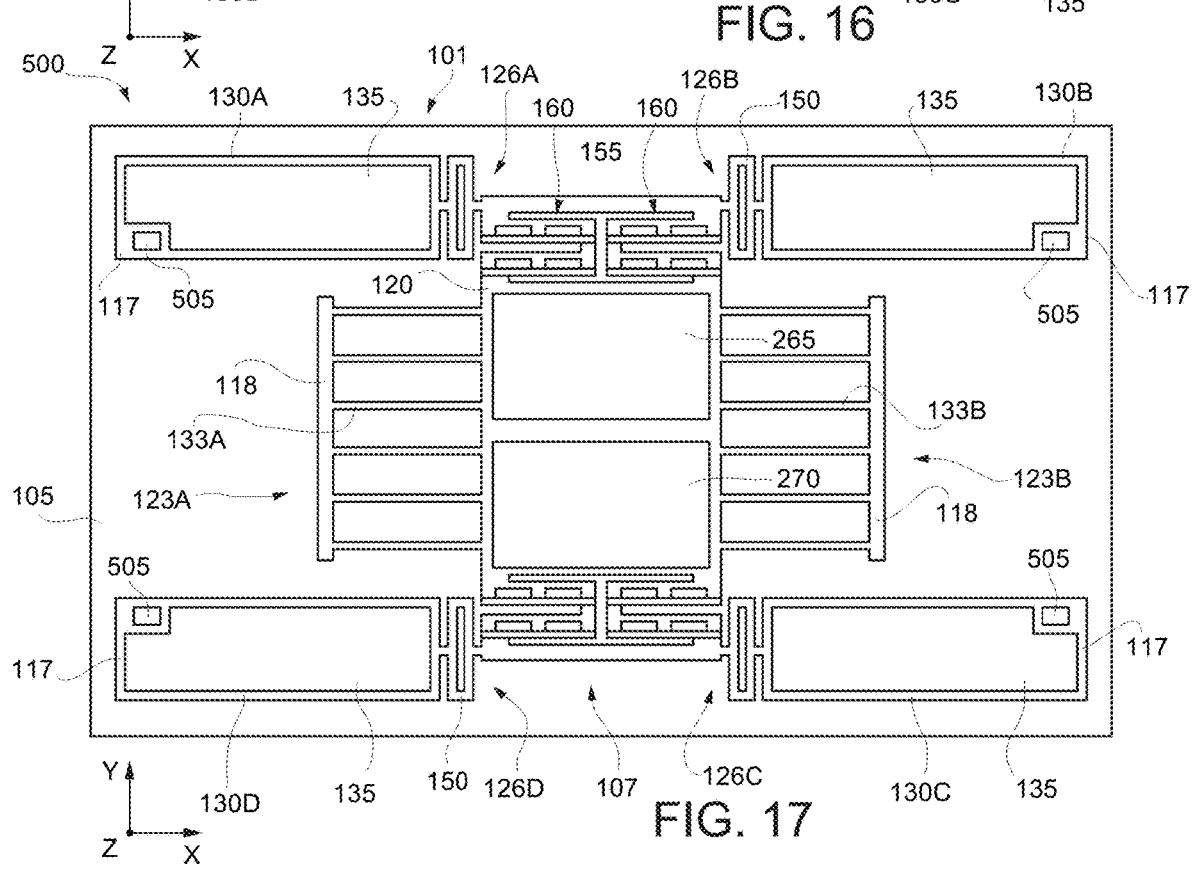

FIG. 17 shows a further embodiment of the present MEMS actuator, here designated by 500. The MEMS actuator 500 has a general structure similar to that of the MEMS actuator 450 of FIG. 16; consequently, elements in common are designated by the same reference numbers and are not described any further.

The MEMS actuator 500 is formed in the body 101 comprising the substrate 105, the structural body 107, and the support body 110, here not illustrated.

The suspended region 115 of the structural body 107 also here forms the mobile mass 120, the constraint structures 123A, 123B, the transformation structures 126A-126D, the actuation structures 130A-130D, and detection elements, here designated by 505. Furthermore, also here these structures are monolithic with respect to one another and to the first and second anchorage regions 117, 118.

In this embodiment, the detection elements 505 are of a piezoelectric type and are each carried by a respective actuation structure 130A-130D.

Each detection element 505 is formed by a stack of layers similar to that of the piezoelectric actuation elements 135 of FIG. 4 and are thus not illustrated here any further.

In detail, the piezoelectric region of each detection element 505 may be of the same piezoelectric material as the piezoelectric region 139 or of a different material, for example AlN.

Specific electrical connection tracks connect the bottom and top electrodes of the detection elements 505 to an external measurement circuit.

In use, deformation of the actuation structures 130A-130D causes a deformation also of the detection elements 520, in particular of the respective piezoelectric regions, integral thereto. This deformation generates a detection voltage between the bottom electrode and the top electrode of the detection element 505, which may be measured by the external measurement circuit.

The detection voltage depends upon the deformation of the detection structure 130. Through specific conversion tables, obtained, for example, in a calibration step, it is possible to convert the value of the detection voltage into a value of deformation of the detection structures 130A-130D and/or of translation of the mobile mass 120.

In practice, the MEMS actuator 500 provides for a closed-loop control system. In particular, the fact that the detection elements operate through a piezoelectric detection principle allows reduction of the energy consumption of the MEMS actuator 500.

Figure 18:
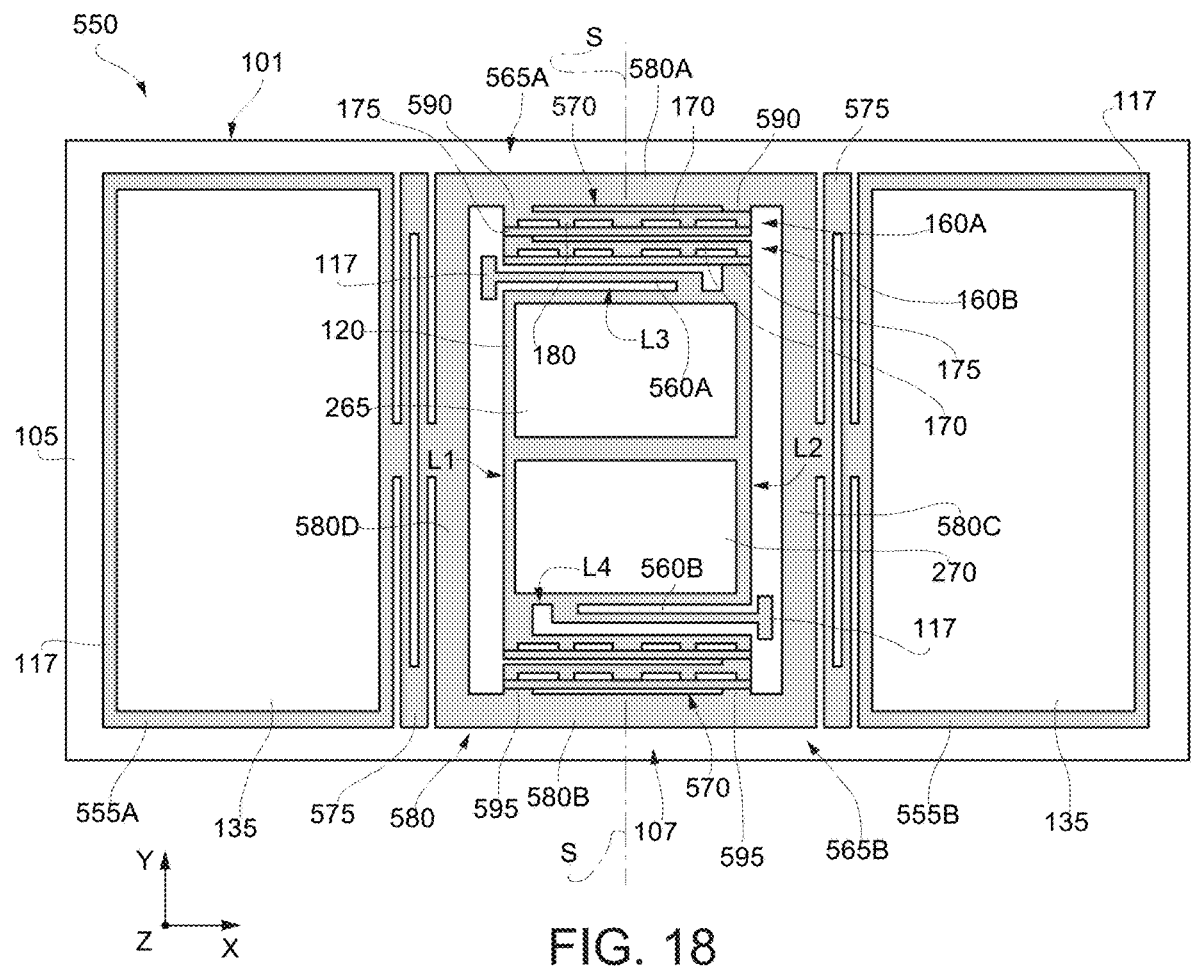

FIG. 18 shows a further embodiment of the present MEMS actuator, here designated by 550. The MEMS actuator 550 has a general structure similar to that of the MEMS actuator 100 of FIG. 3; consequently, elements in common are designated by the same reference numbers and are not described any further.

The MEMS actuator 550 is formed in the body 101 comprising the substrate 105, the structural body 107 (here coloured for reasons of clarity) and the support body 110, here not illustrated. Thus, also here, the structures formed by the support body 110 are monolithic with respect to one another.

In this embodiment, the suspended region 115 of the structural body 107 forms two actuation structures, referred to hereinafter as first and second actuation structures 555A, 555B. The first and second actuation structures 555A, 555B extend alongside the first side L1 and the second side L2, respectively, of the mobile mass 120 and are mutually opposite to the symmetry axis S.

The suspended region 115 of the structural body 107 forms a first elastic constraint structure and a second elastic constraint structure, here designated respectively by 560A and 560B, which each extend between a respective second anchorage region 118 and the third side L3 and the fourth side L4, respectively, of the mobile mass 120, parallel to the first axis X.

The MEMS actuator 550 further comprises two transformation structures, hereinafter referred to as first and second transformation structures 565A and 565B. Each transformation structure 565A and 565B also comprises an elastic conversion structure, designated by 570, and a decoupling structure, designated here by 575.

In this embodiment, the first and second transformation structures 565A, 565B share a same stiffening structure, here designated by 580.

The stiffening structure 580 forms a frame that surrounds the mobile mass 120. In detail, the stiffening structure 580 comprises a first arm 580A and a second arm 580B parallel to one another, extending parallel to the first axis X, and a third arm 580C and a fourth arm 580D, parallel to one another, extending parallel to the second axis Y.

The elastic conversion structure 570 of the first transformation structure 565A extends between the first arm 580A of the stiffening structure 580 and the third side L3 of the mobile mass 120. The elastic conversion structure 570 of the second transformation structure 565B extends between the second arm 580B of the stiffening structure 580 and the fourth side L4 of the mobile mass 120.

Also here, the elastic conversion structures 570 are each formed by a respective first portion 160A and a respective second portion 160B. The first and second portions 160A, 160B are each formed by a respective top elongated portion 170, a respective bottom elongated portion 175, and a plurality of transverse portions 180, as described with reference to FIG. 7.

In this embodiment, the elastic conversion structure 570 of the first transformation structure 565A comprises two connection portions 590, which couple the respective top elongated portion 170 to the stiffening structure 580. In detail, the connection portions 590 rigidly connect respective ends of the top elongated portion 170 to the first arm 580A of the stiffening structure 580.

The elastic conversion structure 570 of the second transformation structure 565B comprises two connection portions 595, which couple the respective bottom elongated portion 175 to the stiffening structure 580. In detail, the first and second connection portions 595A, 595B rigidly connect respective ends of the bottom elongated portion 175 to the second portion 580B of the stiffening structure 580.

In use, a bias voltage applied to the piezoelectric actuation elements 135 causes a translation of the mobile mass 120 parallel to the second axis Y, as discussed above for the MEMS actuator 100 of FIG. 3.

The stiffening structure 580 confers a greater stiffness to the MEMS actuator 550 as compared to the MEMS actuator 100 of FIG. 3. In fact, the stiffening structure 580 is frame-shaped and forms a single structure that is shared by the first and second transformation structures 565A, 565B. This guarantees that the connection portions 590 of the elastic conversion structure 570 of the first transformation structure 565A undergo a same vertical displacement, along the third axis Z, with respect to the connection portions 595 of the elastic conversion structure 570 of the second transformation structure 565B. Consequently, the elastic conversion structures 570 of the first and second transformation structures 565A, 565B guarantee a greater accuracy of displacement of the mobile mass 120.

The MEMS actuator 550 thus has improved mechanical performance.

Figure 19:
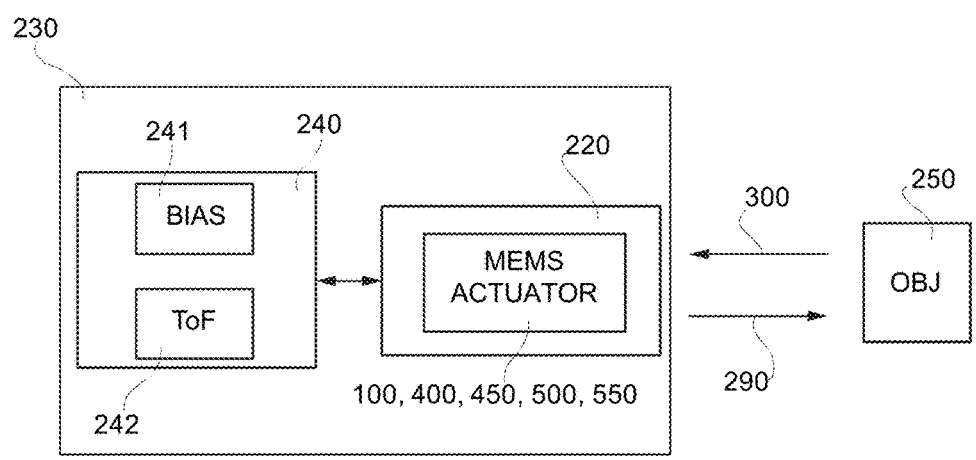
FIG. 19 shows a block diagram of an apparatus comprising the present optical module.

As illustrated in FIGS. 19 and 20, the MEMS actuators 100, 400 450, 500 and 550 may be used to form an optical module 220, which may be integrated in an apparatus 230. The apparatus 230 further comprises a control unit 240, which is coupled to the optical module 220, and may be used for scanning an object 250 arranged at a distance from the apparatus 230 and for reconstructing a three-dimensional structure thereof. In detail, the control unit 240 comprises a bias circuit 241, configured to apply a bias voltage to the piezoelectric actuation elements 135, and a time-of-flight-measuring circuit 242.

In detail, FIG. 20 is a cross-section of the optical module 220. Purely by way of example, the optical module 220 of FIG. 20 is formed from the MEMS actuator 100 of FIG. 3 and shows a cross-section thereof taken along the symmetry plane S.

The optical module 220 comprises a light source 255, an optical detector 260, an optical transmitting element 265, and an optical receiving element 270. The light source 255 and the optical detector 260 are carried by the substrate 105; the optical transmitting element 265 and the optical receiving element 270 are carried by the mobile mass 120.

In detail, the light source 255 and the optical detector 260 are arranged on the first surface 105A of the substrate 105 facing the mobile mass 120.

The light source 255 and the optical detector 260 may each be formed in a respective die of semiconductor material and be bonded on the substrate 105, in particular on the surface 105A, during back-end manufacturing steps.

The light source 255 may be formed, for example, by one or more Vertical-Cavity Surface-Emitting Lasers (VCSELs) 256. In this embodiment, as illustrated in top plan view in FIG. 21, the light source 255 comprises a plurality of VCSEL sources 256 arranged aligned, at a mutual distance along the second axis Y, so as to form a mono-dimensional array.

In use, the time-of-flight-measuring circuit 242 controls the VCSEL sources 256 so as to cause each to generate a respective initial light beam 280, for example in the infrared, which propagates towards the mobile mass 120, along the third axis Z (FIG. 20), as indicated by dashed lines.

The optical detector 260 may be formed by a plurality of photodetectors, such as Single-Photon Avalanche Diodes (SPADs), which are arranged so as to form a two-dimensional detection array in the plane XY. Each photodetector, when hit by a light beam, converts the light beam into a respective electrical signal and sends it to the time-of-flight-measuring circuit 242 through specific electrical connections for subsequent processing.

The optical transmitting element 265 and the optical receiving element 270 are diffractive optical elements, such as multilevel diffractive lenses or meta-lenses. In FIG. 20, for simplicity, the optical transmitting element 265 and the optical receiving element 270 are illustrated as being formed on the first surface 107A of the structural body 107, in particular on the mobile mass 120. However, the optical transmitting element 265 and the optical receiving element 270 may each be formed in a respective portion of the mobile mass 120, for example by specific manufacturing techniques, so as to form a diffraction lattice.

The optical transmitting element 265 is arranged above and vertically aligned along the axis Z with the light source 255 and is configured to modify the shape of the initial light beams 280. In detail, the optical transmitting element 265 collimates each initial light beam 280 in a direction of propagation, here the third axis Z, and expands each initial light beam 280 in a direction perpendicular to the direction of propagation, here the first axis X.

In other words, the initial light beams 280 form, at output from the optical transmitting element 265, a transmission beam 290 formed by a plurality of stripes of light, one for each VCSEL source 256, which are elongated in a direction parallel to the first axis X and propagate in a direction parallel to the third axis Z.

The optical receiving element 270 is arranged above the optical detector 260 and is configured to focus a light beam impinging thereon towards the optical detector 260.

In use, the transmission beam 290 propagates away from the optical apparatus 230 and impinges upon a first portion of the object 250 (FIG. 19). The first portion of the object 250 reflects a part of the transmission beam 290, thus forming a reflected beam 300, which propagates towards the optical apparatus 230.

In detail, each stripe of light of the transmission beam 290 is reflected by a respective part of the first portion of the object 250. The reflected beam 300 is thus also formed by a plurality of light stripes elongated approximately in a direction parallel to the first axis X.

The reflected beam 300 impinges on the optical receiving element 270 and is focused thereby, thus forming a focused beam 310 that impinges on the optical detector 260, forming a pattern of light, as illustrated in FIG. 22.

The optical detector 260, in particular the respective photodetectors, convert the focused beam 310 into a plurality of electrical signals that are sent to the time-of-flight-measuring circuit 242.

The time-of-flight-measuring circuit 242 is configured to measure a time of flight that elapses between generation of the initial light beam 280 by the VCSEL sources 256, and reception of the focused beam 310 by the optical detector 260.

The time of flight varies as a function of the distance of the object 250 from the optical apparatus 230.

In detail, each stripe of light generated by the optical transmitting element 265 has a time of flight that depends upon the distance of the respective part of the object 250 on which it has impinged.

From the time of flight measured for each photodetector of the optical detector 260, the time-of-flight-measuring circuit 242 may obtain a distance of each part of the first portion of the object 250 from the apparatus 230.

To scan the object 250 entirely, the bias circuit 241 applies a bias voltage to the piezoelectric actuation elements 135 of the MEMS actuator 100, causing displacement of the mobile mass 120 in a direction parallel to the second axis Y, as discussed above in detail.

Consequently, as illustrated in FIG. 23, displacement of the mobile mass 120 modifies the relative position between the optical transmitting element 265 and the light source 255, with respect to the rest position of FIG. 20, thus causing a deviation of the transmission beam 290.

In this way, it is possible to scan the object 250 in a direction parallel to the second axis Y.

The time-of-flight-measuring circuit 242 processes the values of time of flight measured for each scanned portion of the object 250 and generates a three-dimensional reconstruction of the object 250.

As described above, the MEMS actuator 100 allows obtainment of a high in-plane displacement, here along the second axis Y, of the mobile mass 120, using a quasi-static actuator, i.e., applying a D.C. biasing voltage or a linear-ramp voltage.

Furthermore, it is possible to scan the object 250 using a desired profile of displacement of the mobile mass 120.

Finally, it is clear that modifications and variations may be made to the MEMS actuators 100, 400, 450, 500 and 550, to the optical module 200, and to the apparatus 230 described and illustrated herein, without thereby departing from the scope of this disclosure.

For instance, the shape of the elastic conversion structures may be different from what has been described.

Further, the elastic conversion structures may have a different number of arms, even just one arm in some instances. In this case, the elastic conversion structures would have a non-folded linear structure.

The bias circuit, which supplies the bias voltage to the actuation elements, and the measurement circuit, which detects the detection voltage in the MEMS actuators 450, 500, may be formed on one or more dice of semiconductor material, internal or external to the structural body 107.

The VCSEL sources 156 may be arranged in a different way on the substrate 105, for example to form a two-dimensional array.

The shape of the mobile mass 120 may vary with respect to the rectangular shape. For instance, it may present sides that are curved and/or formed by segments and/or portions of lines.

The MEMS actuator 100 of FIG. 3 could comprise two actuation structures, which extend in a position adjacent, respectively, to the third and fourth sides L3, L4 of the mobile mass 120, parallel to the second axis Y. In this case, the decoupling structures would each extend between the free end of the respective actuation structure and the stiffening structure. In this case, further, the decoupling structures could be rotated by 90° about the third axis Z with respect to the decoupling structures 150 of FIG. 3.

In addition, when the present MEMS actuator is used to form the optical module 220, the mobile mass 120 may be further processed, on the basis of the requirements of the specific application, in particular on the basis of the desired optical and/or mechanical properties. To that regard, the optical module 220 may be modified as described in the patent application U.S. Ser. No. 17/124,027, filed on Dec. 16, 2020, with reference to FIGS. 7-15 and as briefly discussed hereinafter.

FIGS. 24-30 show the present optical module and the present MEMS actuator according to different embodiments.

The optical module of FIGS. 24-30 and the respective MEMS actuators have a general structure similar to that, respectively, of the optical module 220 and of the MEMS actuators 100, 400, 500, 550; consequently, elements in common are designated by the same reference numbers and are not described any further.

Figure 24:
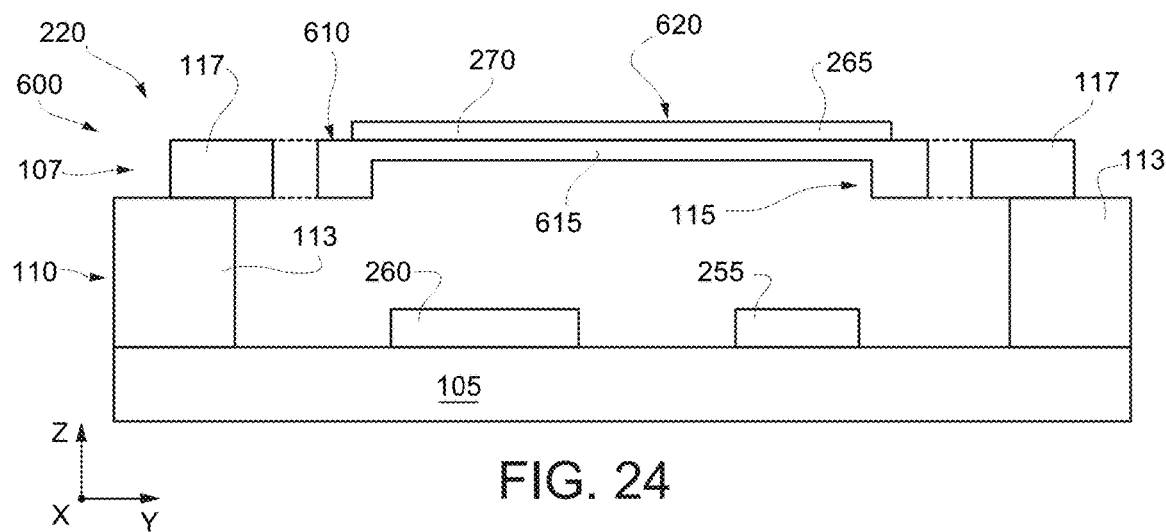
FIGS. 24-28 each show a cross-section of the present optical module, according to a respective embodiment.

In detail, the MEMS actuator of FIG. 24, designated here by 600, is formed by the substrate 105, the structural body 107, and the support body 110. The structural body 107 is shaped to form the first anchorage regions 117, the second anchorage regions (here not illustrated), and the suspended region 115.

The suspended region 115 also here forms the mobile mass, designated by 610. The transformation, constraint, and actuation structures are represented schematically, for simplicity, by dashed lines between the mobile mass 610 and the first anchorage regions 117.

The mobile mass 610 comprises a central portion 615, which has been thinned out during the manufacturing process. For instance, the central portion 615 may have a thickness comprised between 1 µm and 5 µm.

The optical receiving element 270 and the optical transmitting element 265 are here formed in a single body 620, for example of silicon, by suitable manufacturing techniques. The single body 620 is carried by the mobile mass 610; for example, it is bonded on the mobile mass 610. The light source 255 and the optical detector 260 are arranged on the substrate 105, facing the central portion 615 of the mobile mass 610. In particular, the light source 255 and the optical detector 260 face, respectively, the optical transmitting element 265 and the optical receiving element 270.

In use, the light beam generated by the light source 255 and the reflected beam focused on the optical detector 260 by the optical receiving element 270 crosses the central portion 615 of the mobile mass 610. Since the central portion 615 of the mobile mass 610 is thin, the light beam generated by the light source and the beam focused by the optical receiving element 270 undergo a reduced absorption.

Figure 25:
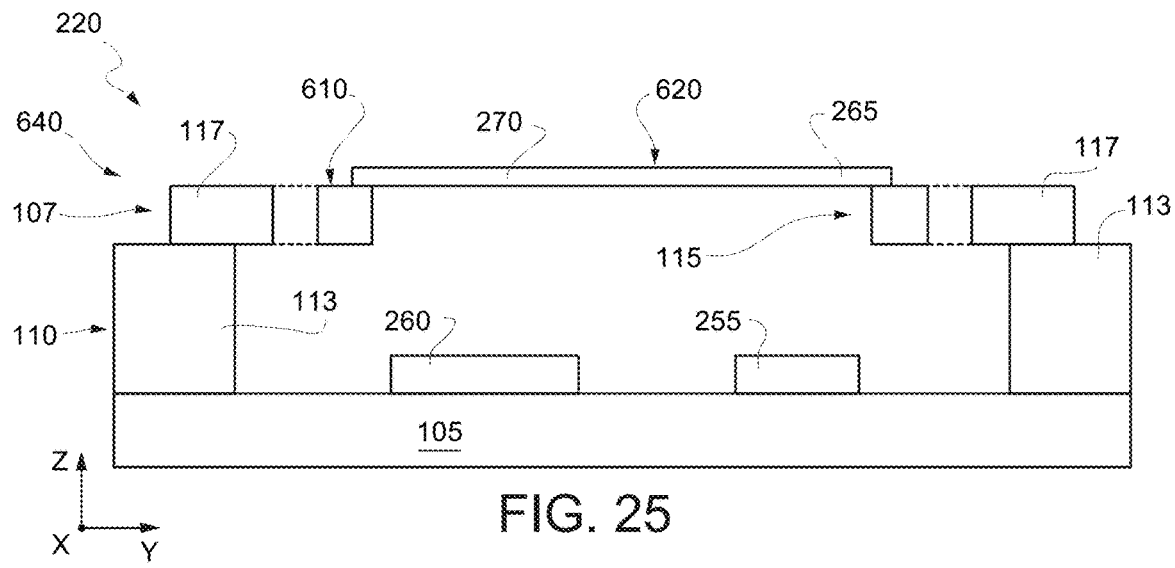

In the MEMS actuator of FIG. 25, here designated by 640, the central portion 615 of the mobile mass 610 of the MEMS actuator 600 has been completely removed, for example so that the mobile mass 610 forms a frame. In practice, the light source 255 and the optical detector 260 directly face the optical transmitting element 265 and the optical receiving element 270, respectively. In use, then, the light beam generated by the light source 255 and the reflected beam focused on the optical detector 260 by the optical receiving element 270 do not cross the mobile mass 610; thus, they may be subject to a further reduced absorption.

Figure 26:
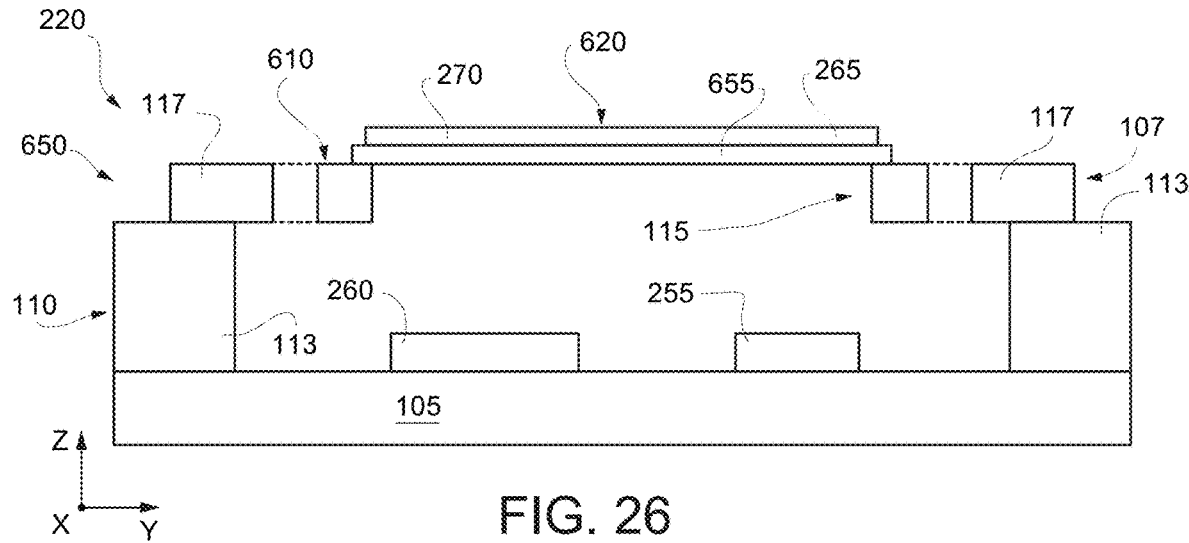

Also in the MEMS actuator of FIG. 26, designated here by 650, the central portion 615 of the mobile mass 610 of the MEMS actuator 600 has been completely removed. The optical module 220 here comprises an optical substrate 655, for example of glass, bonded on the mobile mass 610 at a peripheral portion thereof. The single body 620 is bonded on the optical substrate 655. The optical module of FIG. 27, here designated by 660, comprises a packaging body 665, for example of glass, which is bonded to the structural body 107. In detail, the packaging body 665 is bonded to the first surface 107A of the first anchorage regions 117 by respective bonding portions 670, which extend peripherally. The packaging body 660 forms a protecting element from external agents.

Figure 27:
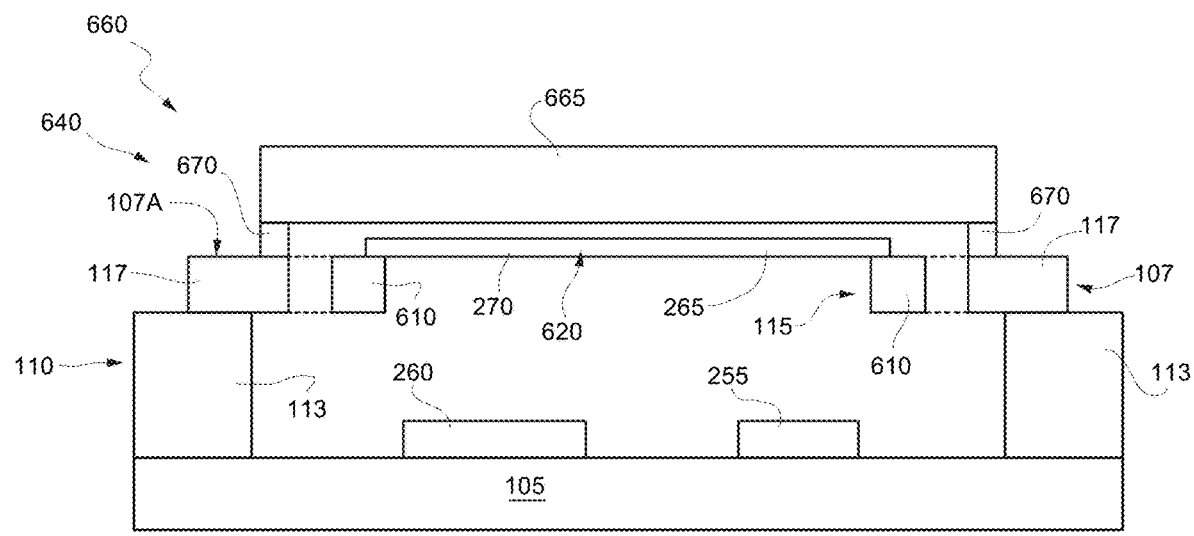
Figure 28:
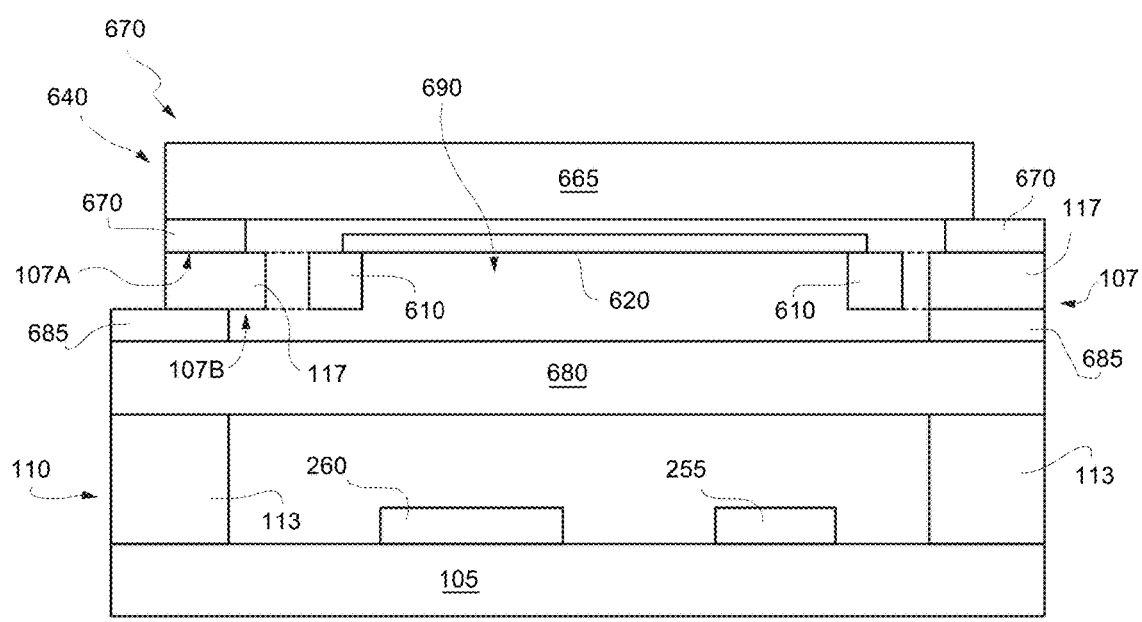

The optical module of FIG. 28, here designated by 670, comprises a first packaging body 675, which is the same as the packaging body 665 of the optical module 660 of FIG. 27, and a second packaging body 680. The second packaging body 680, for example, of glass, extends between the support body 110 and the structural body 107.

In detail, the second packaging body 680 has a first face bonded to the pillars 113 of the support body 110 and a second face bonded to the structural body 107, in particular to the second surface 107B of the first anchorage regions 117, by respective bonding portions 685.

In practice, the first and second packaging bodies 665, 680 form a compartment 690 that seals the MEMS actuator 640, in particular the mobile mass 610. Consequently, it is possible to control the internal pressure of the compartment 690, as may be useful in some applications.

Figure 29:
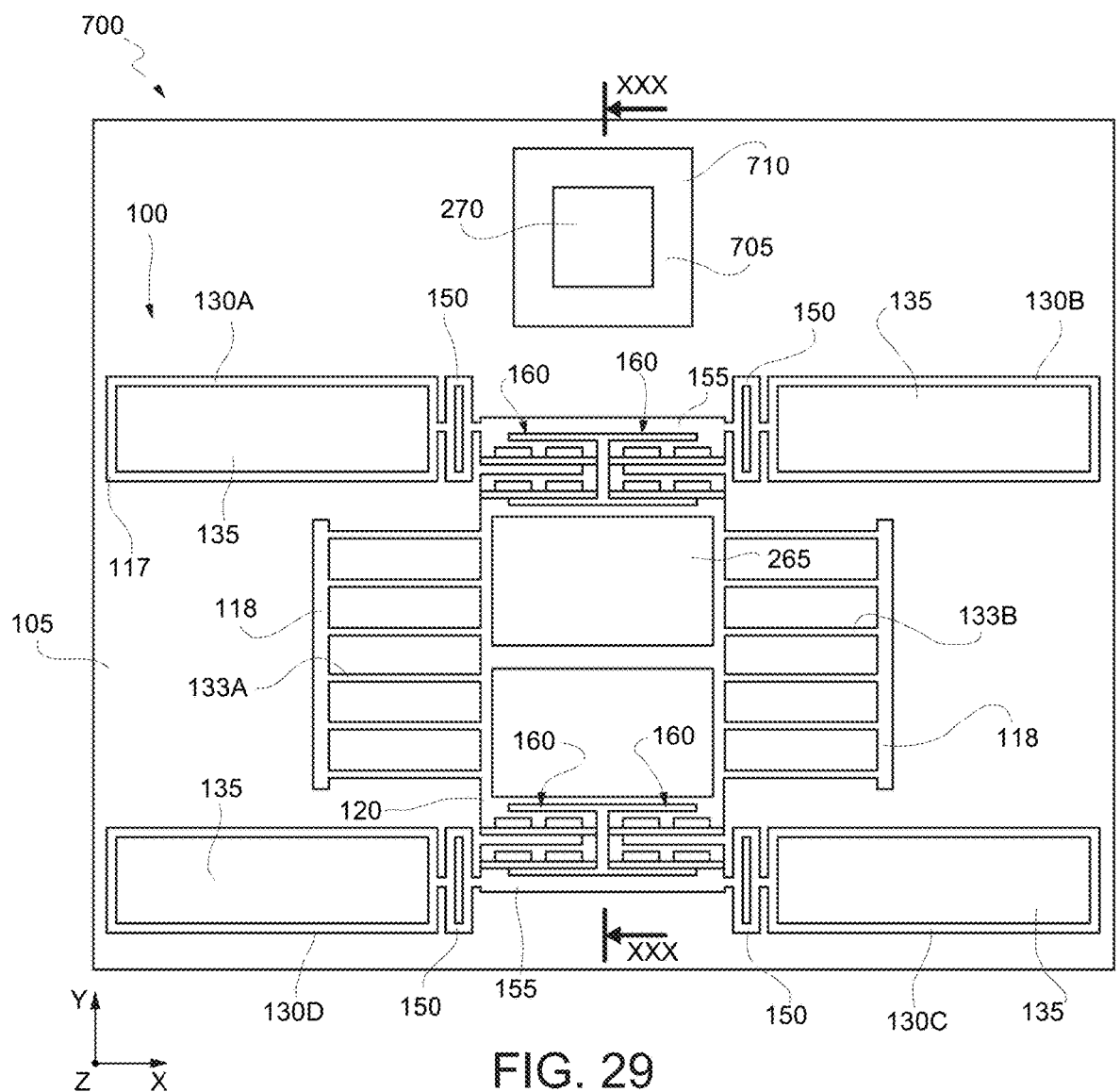
FIG. 29 shows a top plan view of the present optical module, according to a different embodiment.
Figure 30:
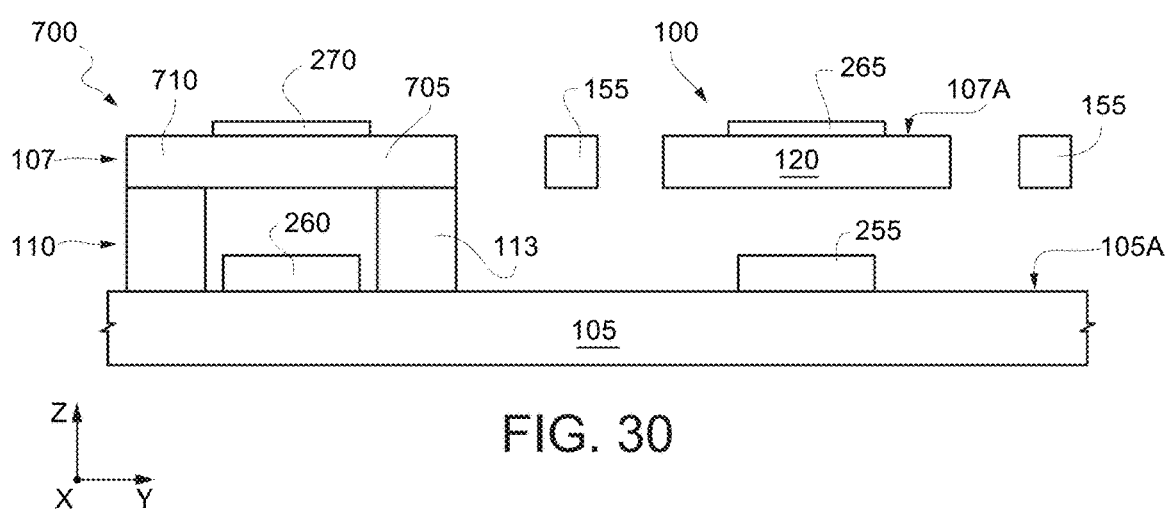
FIG. 30 is a cross-sectional view of the optical module of FIG. 29, along the section line XXX-XXX of FIG. 29.

The optical module of FIGS. 29 and 30, here designated by 700, is formed starting from the MEMS actuator 100 of FIG. 3. The optical module 700 also comprises a fixed mass 705, for example formed in the structural body 107, which is separate from the MEMS actuator 100. The fixed mass 705 is suspended over the substrate 105, faces the optical detector 260, and is fixed on the sides to a respective third anchorage region 710. The third anchorage region 710 is fixed on respective pillars 113 of the support body 110.

In the optical module 700, the optical transmitting element 265 is carried by the mobile mass 120, whereas the optical receiving element 270 is carried by the fixed mass 705. In practice, in use, when a bias voltage is applied to the piezoelectric actuation elements 135, the optical transmitting element 265 moves, consequently deflecting the initial light beam, as illustrated in FIG. 12, while the optical receiving element 270 remains fixed.

The embodiments described may be combined to form further embodiments.

The invention claimed is:

1. A MEMS actuator, comprising:
   a substrate;
   a mobile mass suspended over the substrate at a rest height measured along a first direction and extending in a plane of extension defined by a second direction and a third direction both perpendicular to the first direction;
   elastic elements arranged between the substrate and the mobile mass, the elastic elements having a first compliance parallel to the first direction and a second compliance parallel to the second direction, the first compliance being lesser than the second compliance;
   a plurality of piezoelectric actuation structures, wherein each piezoelectric actuation structure has a fixed portion that is fixed with respect to the substrate and a mobile portion configured to deform in a direction parallel to the first direction in response to an actuation voltage; and
   a plurality of movement-transformation structures, wherein each movement-transformation structure comprises:
      an elastic movement-conversion structure arranged between a respective one of the plurality of piezoelectric actuation structures and the mobile mass;
      each elastic movement-conversion structure being compliant in a direction parallel to a movement-transformation plane formed by the first and second directions and having, in the movement-transformation plane, a first principal axis of inertia and a second principal axis of inertia; and
      wherein the first and second principal axes of inertia are transverse with respect to the first and second directions so that a deformation of each of the plurality of piezoelectric actuation structures in the movement-transformation plane causes a corresponding movement of the mobile mass along the second direction.

2. The MEMS actuator according to claim 1, wherein the mobile mass has first and second sides opposite each other with respect to a median plane parallel to the movement-transformation plane, and third and fourth sides opposite each other with respect to a median axis parallel to the third direction, wherein the elastic elements are arranged adjacent to the first and second sides of the mobile mass and the plurality of movement-transformation structures are arranged adjacent to the third and fourth sides of the mobile mass.

3. The MEMS actuator according to claim 2, wherein the elastic movement-conversion structures of the plurality of movement-transformation structures adjacent to the third and the fourth sides of the mobile mass have mutually equal shapes, translated along the second direction.

4. The MEMS actuator according to claim 1, wherein each elastic movement-conversion structure comprises at least one elongated structure including a first elongated portion, a second elongated portion, and a plurality of transverse portions, the first elongated portion and the second elongated portion extending, at rest, generally parallel to one another and to the third direction, and being arranged at different heights from the substrate in the first direction, each transverse portion extending between the first elongated portion and the second elongated portion.

5. The MEMS actuator according to claim 4, wherein the at least one elongated structure is a first elongated structure and each elastic conversion structure also comprises a second elongated structure coupled to the first elongated structure forming, in a top view of the MEMS actuator, a folded spring.

6. The MEMS actuator according to claim 5, wherein the second elongated structure is equal to the first elongated structure and being translated along the second direction.

7. The MEMS actuator according to claim 1, wherein the elastic elements and the elastic movement-conversion structures are rigid with respect to the third direction.

8. The MEMS actuator according to claim 1, wherein each of the plurality of piezoelectric actuation structures extend parallel to the third direction and have a free end, wherein the plurality of movement-transformation structures each further comprise an elastic translation structure extending between a free end of a respective one of the plurality of piezoelectric actuation structure and a first end of a respective elastic movement-conversion structure, each elastic translation structure being configured to transfer a movement of the free end of the respective one of the plurality of piezoelectric actuation structures into a translation of the first end of the respective elastic movement-conversion structure, parallel to the first direction.

9. The MEMS actuator according to claim 8, wherein each elastic translation structure comprises an elastic decoupling structure and a stiffening structure, the elastic decoupling structure being configured to deform in a direction parallel to the first direction and the third direction, wherein the stiffening structure extends along the third direction between the elastic decoupling structure and the elastic movement-conversion structure.

10. The MEMS actuator according to claim 9, wherein the stiffening structure forms a frame that surrounds the mobile mass and the elastic movement-conversion structures, each of the elastic movement-conversion structures being fixed with respect to the frame, each elastic decoupling structure and each of the plurality of piezoelectric actuation structure being arranged externally with respect to the frame.

11. The MEMS actuator according to claim 1, wherein each of the plurality of piezoelectric actuation structures each comprise a first portion and a second portion coupled to the first portion, the first and the second portions each having an elongated structure and extending in a direction parallel to one another, the first portion being coupled to a respective one of the plurality of movement-transformation structures, the second portion being coupled to the substrate, the first and the second portions being connected to distinct bias structures configured to deform the first portion and the second portion in the first direction and in a fourth direction parallel to the first direction and opposite thereto.

12. The MEMS actuator according to claim 1, further comprising a set of detection elements, which are coupled to the plurality of piezoelectric actuation structures.

13. The MEMS actuator according to claim 12, wherein the set of detection elements are of a piezoelectric or piezoresistive type.

14. The MEMS actuator according to claim 1, wherein the mobile mass, the elastic elements, the plurality of piezoelectric actuation structures, and the plurality of movement-transformation structures are formed by a monolithic body that is substantially planar at rest, the monolithic body comprising a layer of semiconductor material.

15. An apparatus, comprising:
an optical module, comprising:
a MEMS actuator comprising:
a substrate;
a mobile mass, the mobile mass being suspended over the substrate at a rest height measured along a first direction and extending in a plane of extension defining a second direction and a third directions perpendicular to the first direction;
elastic elements arranged between the substrate and the mobile mass, the elastic elements having a first compliance parallel to the first direction and a second compliance parallel to the second direction, the first compliance being lesser than the second compliance;
a plurality of piezoelectric actuation structures, wherein each piezoelectric actuation structure has a fixed portion that is fixed with respect to the substrate and a mobile portion configured to deform in a direction parallel to the first direction in response to an actuation voltage; and
a plurality of movement-transformation structures, wherein each movement-transformation structure comprises:
an elastic movement-conversion structure arranged between a respective one of the plurality of piezoelectric actuation structures and the mobile mass;
each elastic movement-conversion structure being compliant in a direction parallel to a movement-transformation plane formed by the first and the second directions and having, in the movement-transformation plane, a first principal axis of inertia and a second principal axis of inertia; and
wherein the first and second principal axes of inertia are transverse with respect to the first and second directions so that a deformation of each of the plurality of piezoelectric actuation structures in the movement-transformation plane causes a corresponding movement of the mobile mass along the second direction;
a light source supported by the substrate of the MEMS actuator and configured to generate an initial light beam propagating towards the mobile mass;
an optical detector supported by the substrate of the MEMS actuator and configured to detect an incoming light beam;
an output optical element supported by the mobile mass and facing the light source, the output optical element configured to modify a direction of propagation of the initial light beam as a function of a relative position between the light source and the output optical element, thereby generating an output light beam; and
an input optical element configured to focus the incoming light beam on the optical detector.

16. The apparatus according to claim 15, wherein the mobile mass has first and second sides opposite with respect to a median plane parallel to the movement-transformation plane, and third and fourth sides opposite with respect to a median axis parallel to the third direction, wherein the elastic elements are arranged adjacent to the first and second sides of the mobile mass and the plurality of movement-transformation structures are arranged adjacent to the third and fourth sides of the mobile mass.

17. The apparatus according to claim 16, wherein the elastic movement-conversion structures of the plurality of movement-transformation structures adjacent to the third side and the fourth side of the mobile mass have mutually equal shapes, translated along the second direction.

18. The apparatus according to claim 15, wherein each elastic movement-conversion structure comprises at least one elongated structure including a first elongated portion, a second elongated portion, and a plurality of transverse portions, the first elongated portion and the second elongated portion extending, at rest, generally parallel to one another and to the third direction, and being arranged at different heights from the substrate in the first direction, each transverse portion extending between the first elongated portion and the second elongated portion.

19. The apparatus according to claim 18, wherein the at least one elongated structure is a first elongated structure and each elastic conversion structure also comprises a second elongated structure coupled to the first elongated structure forming, in a top view of the MEMS actuator, a folded spring.

20. The apparatus according to claim 15, wherein the apparatus is configured for scanning a light beam on an object arranged at a distance from the apparatus; and further comprising:
a first circuit, configured to measure a time of flight between emission of the initial light beam and reception of a reflected light beam; and
a second circuit, configured to apply a bias voltage to each of the plurality of piezoelectric actuation structures of the MEMS actuator, the bias voltage causing a movement of the mobile mass along the second direction, wherein the movement of the mobile mass varies the relative position between the output optical element and the light source, thus modifying the direction of propagation of the output light beam.

* * * * *